US009762025B2

(12) United States Patent
Johnson et al.

(10) Patent No.: US 9,762,025 B2
(45) Date of Patent: Sep. 12, 2017

(54) TEMPERATURE INSENSITIVE INTEGRATED ELECTRO-ABSORPTION MODULATOR AND LASER

(71) Applicant: TeraMod LLC, Murphy, TX (US)

(72) Inventors: Ralph Herbert Johnson, Murphy, TX (US); Gary Alan Evans, Plano, TX (US)

(73) Assignee: TeraMod LLC, Plano, TX (US)

( * ) Notice: Subject to any disclaimer, the term of this patent is extended or adjusted under 35 U.S.C. 154(b) by 0 days.

(21) Appl. No.: 15/045,461

(22) Filed: Feb. 17, 2016

(65) Prior Publication Data
US 2017/0237226 A1 Aug. 17, 2017

(51) Int. Cl.
*H01S 5/026* (2006.01)
*G02F 1/01* (2006.01)
*H01S 5/00* (2006.01)
*H01S 5/022* (2006.01)
*H01S 5/024* (2006.01)
(Continued)

(52) U.S. Cl.
CPC .......... *H01S 5/0085* (2013.01); *G02F 1/0123* (2013.01); *G02F 1/01708* (2013.01); *H01S 5/0224* (2013.01); *H01S 5/0265* (2013.01); *H01S 5/02453* (2013.01);
(Continued)

(58) Field of Classification Search
None
See application file for complete search history.

(56) References Cited

U.S. PATENT DOCUMENTS 5,953,479 A * 9/1999 Zhou ............... B82Y 20/00
372/45.01
6,233,082 B1 * 5/2001 Johnson ............ H01S 5/0265
359/237
(Continued)

OTHER PUBLICATIONS

Piprek, J., Chiu, Y.-J., Zhang, S.-Z., Bowers, J.E., Prott, C., Hillmer, H., High-Efficiency MQW Electroabsorption Modulators, University of California, ECE Department, Santa Barbara, CA now with Zaffire, Inc., San Jose, CA, Universitaut GH Kassel, Technische Elektronic, Germany.

*Primary Examiner* — Hemang Sanghavi
(74) *Attorney, Agent, or Firm* — Vinson & Elkins LLP

(57) ABSTRACT

Apparatuses and methods for a temperature insensitive electro-absorption modulator and laser. The device comprising a laser capable of emitting light. The laser itself includes a laser gain section, a first mirror and a second mirror. Each of the mirrors are coupled to the laser gain section. The laser gain section contains quantum wells. The first mirror and the second mirror have a wavelength bandwidth sufficient for a lasing wavelength range of the laser. A modulator is coupled to the laser to receive the light and is capable of modulating the light to vary the output from the modulator. The modulator contains quantum wells and has a quantum well confinement factor that is greater than 0.1. An output coupler is coupled to the modulator and the output coupler has a back reflection that is less than half of a back reflection of the second mirror. The laser has a lasing wavelength that tracks the absorption spectrum of the modulator. The device is operated at a temperature range comprising a first temperature and a second temperature, wherein the second temperature is greater than the first temperature by at least 15 degrees Celsius.

47 Claims, 34 Drawing Sheets

(51) Int. Cl.
*H01S 5/0683* (2006.01)
*H01S 5/125* (2006.01)
*G02F 1/017* (2006.01)
*G02F 1/015* (2006.01)

(52) U.S. Cl.
CPC ............ *H01S 5/0683* (2013.01); *H01S 5/125* (2013.01); *G02F 2001/0157* (2013.01)

(56) References Cited

U.S. PATENT DOCUMENTS

| | | | |
|---|---|---|---|
| 6,665,105 B2 * | 12/2003 | Wipiejewski | G02F 1/011 359/240 |
| 2002/0075549 A1 * | 6/2002 | Ash | G02F 1/0123 359/245 |
| 2003/0048976 A1 * | 3/2003 | Lundqvist | H01S 5/0265 385/14 |
| 2005/0275920 A1 * | 12/2005 | Sumi | B82Y 20/00 359/241 |
| 2007/0235715 A1 * | 10/2007 | Makino | B82Y 20/00 257/13 |
| 2008/0219315 A1 * | 9/2008 | Makino | B82Y 20/00 372/50.1 |
| 2009/0245298 A1 * | 10/2009 | Sysak | B82Y 20/00 372/22 |

* cited by examiner 850 nm structure: QW confinement factors

| Well 1 | Well 2 | Well 3 | Well 4 | Well 5 | Well 6 | Well 7 | Well 8 | Well 9 | Well 10 | All QWs |
|---|---|---|---|---|---|---|---|---|---|---|
| 2.52E-02 | 2.86E-02 | 3.13E-02 | 3.32E-02 | 3.41E-02 | 3.41E-02 | 3.30E-02 | 3.10E-02 | 2.82E-02 | 2.47E-02 | 3.04E-01 |

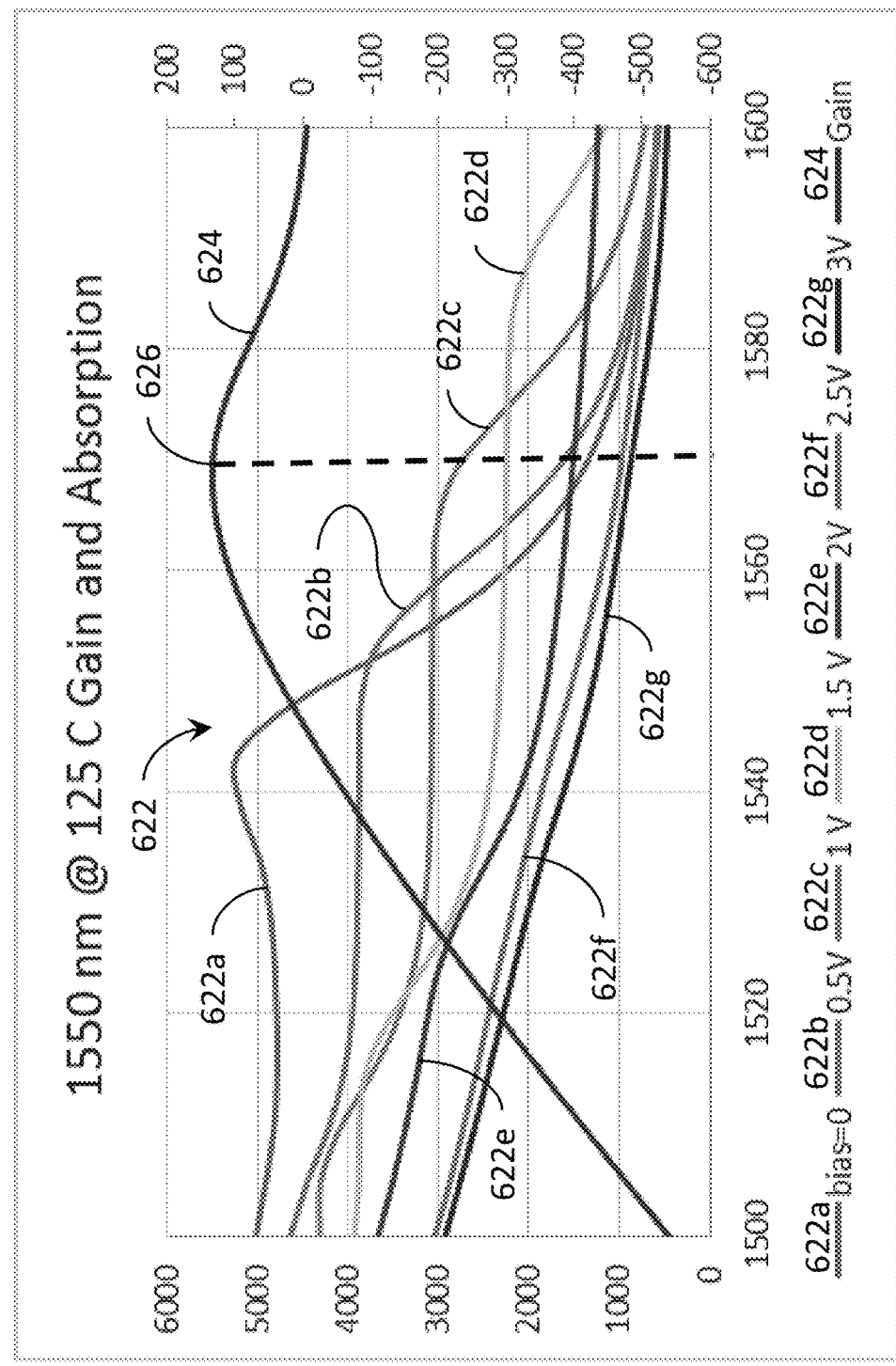

"Thick" 1550 nm 10 QW structure: QW confinement factors

| Well 1 | Well 2 | Well 3 | Well 4 | Well 5 | Well 6 | Well 7 | Well 8 | Well 9 | Well 10 | All QWs |
|---|---|---|---|---|---|---|---|---|---|---|
| 1.97E-02 | 2.00E-02 | 2.01E-02 | 1.99E-02 | 1.94E-02 | 1.87E-02 | 1.78E-02 | 1.67E-02 | 1.54E-02 | 1.40E-02 | 1.82E-01 |

"Thin" 1550 nm 10 QW structure: QW confinement factors

| Well 1 | Well 2 | Well 3 | Well 4 | Well 5 | Well 6 | Well 7 | Well 8 | Well 9 | Well 10 | All QWs |
|---|---|---|---|---|---|---|---|---|---|---|
| 1.77E-02 | 1.90E-02 | 1.99E-02 | 2.06E-02 | 2.10E-02 | 2.10E-02 | 2.06E-02 | 1.99E-02 | 1.90E-02 | 1.77E-02 | 1.96E-01 |

TEMPERATURE INSENSITIVE INTEGRATED ELECTRO-ABSORPTION MODULATOR AND LASER

BACKGROUND

Electro-Absorption modulators are commonly used in many modern communication components for data transmission. They are often integrated with lasers, which are of a nominally fixed wavelength for use in WDM or CWDM applications. This makes them highly temperature sensitive requiring them to have excellent temperature control. This translates to high cost and high power consumption per bit thus effectively eliminating their ability to be used in low cost LAN devices or for inside the box applications or other short haul applications. In addition, they tend to be long with a large area making them hard to drive at high speeds.

Direct modulation of VCSELs has reached its limit for speed in LAN applications due to fundamental device physics at a bandwidth of around 25 GHz. To solve this problem VCSELs with integrated modulators have been proposed, but none has been able to demonstrate suitable performance. The dominant problem is the nearly fixed wavelength of the VCSEL combined with the large change in the absorption spectrum of the modulator with temperature.

To solve this problem a laser whose wavelength tracks the absorption spectrum of the modulator as a function of temperature can be used. Combining this with a modulator with a wide spectral response allows a large temperature range with substantial process tolerance. Also by using a modulator with a high absorption coefficient using direct band to band quantum well absorption the size and thus the capacitance of the modulator can be reduced significantly enhancing the speed.

Another problem is the variation that arises with the modulation of back reflection from the modulator section into the laser. This results in the modulation of the laser and resultant eye closure. One method of dealing with this problem is through the use of an optical isolator. However, this adds a great deal of extra cost and complexity and is not practical for a low cost integrated modulator.

One solution for minimizing back reflection variation is by using an output coupler after the modulator, which has very high output coupling and low back reflection. There are various structures that have been proposed that allow high output coupling with low back reflection.

One example of a possible structure is simply to provide for an anti-reflection coating at the output end of the modulator. This has the problem that external components could reflect back into the laser if not intentionally aligned to avoid this. Intentionally aligning to reduce back reflection is a possible solution but the downsides are: high cost, difficulty of facet coatings and horizontal emission, which is inconvenient for coupling to fibers.

Another example of a possible structure is to provide for a micro-machined output mirror at or near 45 degrees at the output end of the modulator. This is a suitable method to achieve low back reflection. With AR coatings it can be used effectively to achieve the desired goals of low back reflection and nominally vertical coupling, which can be designed to be somewhat off vertical. It has one primary difficulty. The tight vertical mode confinement in the modulator and laser section required for optimal performance translates to an excessively high beam angle. This can be accounted for with suitable lensing on the backside of the device if substrate emission is used or other external optics.

A more preferable method to achieve high output coupling is to provide for a high efficiency grating coupler. This can be designed to avoid coupling back reflected light into the modulator and can be used to achieve (near) vertical emission from the surface or through the substrate. The high efficiency grating coupler can launch the light off vertical to avoid coupling back into the laser from downstream optics and is effective at coupling the highly confined modes to a low divergence beam.

For the foregoing reasons, there is a need for temperature insensitive electro-absorption modulator and laser. The laser has a wavelength that tracks the absorption spectrum of the electro-absorption modulator ("EAM" or "modulator") as a function of temperature. This mutually tracking laser-modulator allows a large temperature range with substantial process tolerance. Also, the modulator has a high absorption coefficient using direct band to band quantum well absorption, thereby significantly reducing the size and thus the capacitance of the modulator, bringing about significant enhancements in speed.

The subject matter claimed herein is not limited to embodiments that solve any disadvantages or that operate only in environments such as those described above. Rather, this background is only provided to illustrate one example technology where some embodiments described herein may be practiced.

SUMMARY

It is therefore an object of the present invention to provide apparatuses and methods for a temperature insensitive electro-absorption modulator and laser. The present invention provides for a laser capable of emitting light. The laser itself includes a laser gain section, a first mirror and a second mirror. Each of the mirrors are coupled to the laser gain section. The laser gain section contains quantum wells. The first mirror and the second mirror have a wavelength bandwidth sufficient for a lasing wavelength range of the laser. A modulator is coupled to the laser to receive the light and is capable of modulating the light to vary the output from the modulator. The modulator contains quantum wells and has a quantum well confinement factor that is greater than 0.1. An output coupler is coupled to the modulator and the output coupler has a back reflection that is less than half of a back reflection of the second mirror. The laser has a lasing wavelength that tracks the absorption spectrum of the modulator.

It is also an object of the present invention to provide for a method of modulating a device by emitting light from a laser. The light is then passed through a modulator. The modulator is modulated by applying a voltage signal so as to vary the light output of the light passing through the modulator. The modulator is less than 50 microns in length. The light is then passed through an output coupler that then outputs the light and the light has a lasing wavelength that is within the spectral region of a substantial absorption response to the voltage signal. The device is operated at a temperature range comprising a first temperature and a second temperature, wherein the second temperature is greater than the first temperature by at least 15 degrees Celsius.

The system of the present invention also provides for optional heating elements coupled to the laser and the modulator and can be adjusted to optimize the modulation of the light passing through the modulator. An optional photodiode may be coupled to the output coupler to monitor the modulation and output power of the modulator based on a current passing through the photodiode. The current passing through this photodiode coupled to the output coupler can be used to adjust the modulation amplitude of the modulator. An optional photodiode may also be coupled to the laser to sense and control the power of the laser based on the current passing through the photodiode. The current passing through this photodiode can be used to adjust the laser bias. Furthermore, the current passing through this photodiode coupled to the laser can also be used to adjust the bias and the modulation amplitude of the modulator.

The laser itself may be a Distributed Bragg Reflectivity laser using high spectral bandwidth mirrors. The mirrors may be enhanced coupling strength gratings. At least one mirror should also have high reflectivity of more than 75% and a length of less than 100 microns. The output coupler may be a second order enhanced coupling strength grating. The quantum wells should have a peak absorption coefficient greater than 1300 per centimeter.

It is also an object of the present invention to provide an electro-absorption modulator, where the modulator is less than 50 micrometers in length.

It is also an object of the present invention to provide for a system with a control circuit added to the electro-absorption modulator. The control circuit has a modulator driver that drives the modulator and a system controller that controls the modulator driver. The system controller can be used to sense the AC and DC current in the modulator and a photodiode. The system controller can be used to optimize the laser bias based on the AC current or the DC current through the modulator. The system controller can also be used to optimize the modulator DC voltage bias based on the AC current or the DC current through the modulator. A current through the modulator and the photodiode can also be sensed by the control circuit in a feedback loop to adjust the drive conditions.

It is also an object of the present invention where the modulator is a wavefunction overlap modulator so that absorption at the lasing wavelength is decreased with increasing reverse bias. The modulator also may use band edge shift to provide modulation so that absorption at the lasing wavelength is increased with increasing reverse bias.

It is also an object of the present invention to provide quantum well confinement factors for the modulator and the laser that are both greater than 0.1. The quantum wells should also have a peak absorption coefficient for the high absorption state greater than 1300 per centimeter.

It is also an object of the present invention that the light output from the output coupler is either through a substrate, or through a top surface or both.

It is also an object of the present invention that the laser with integrated modulator is flip-chip mountable.

It is also an object of the present invention that the temperature difference between the laser and the modulator can be controlled using various methods. One method involves controlling the temperature difference by controlling the optical power coupling from the laser to the modulator. Another method involves controlling the temperature difference by controlling the current passing through the laser. Yet another method involves controlling the temperature difference by controlling DC applied voltage on the modulator. Yet another method involves controlling the temperature difference by using at least one heater element.

It is also an object of the present invention to enable the selection of the operating wavelength of the laser with integrated modulator using the laser driving current, the temperature of the laser, or both.

BRIEF DESCRIPTION OF THE DRAWINGS

These and other features, aspects, and advantages of the present disclosure will become better understood with regard to the following description, appended claims, and accompanying drawings where:

FIG. 5E is a table depicting the quantum well confinement factor calculation results for an 850 nm structure.

FIG. 6C is a graph depicting the absorption spectrum of the modulator as a function of applied bias along with the gain spectrum under the lasing condition at 125 C for a 1550 nm laser.

FIG. 6F is a table depicting the quantum well confinement factor calculation results for a thick 1550 nm structure.

FIG. 6H is a table depicting the quantum well confinement factor calculation results for a thin 1550 nm structure.

Like reference numerals are used to describe like parts in all figures of the drawings.

DESCRIPTION OF THE PREFERRED EMBODIMENTS

Figure 1A:
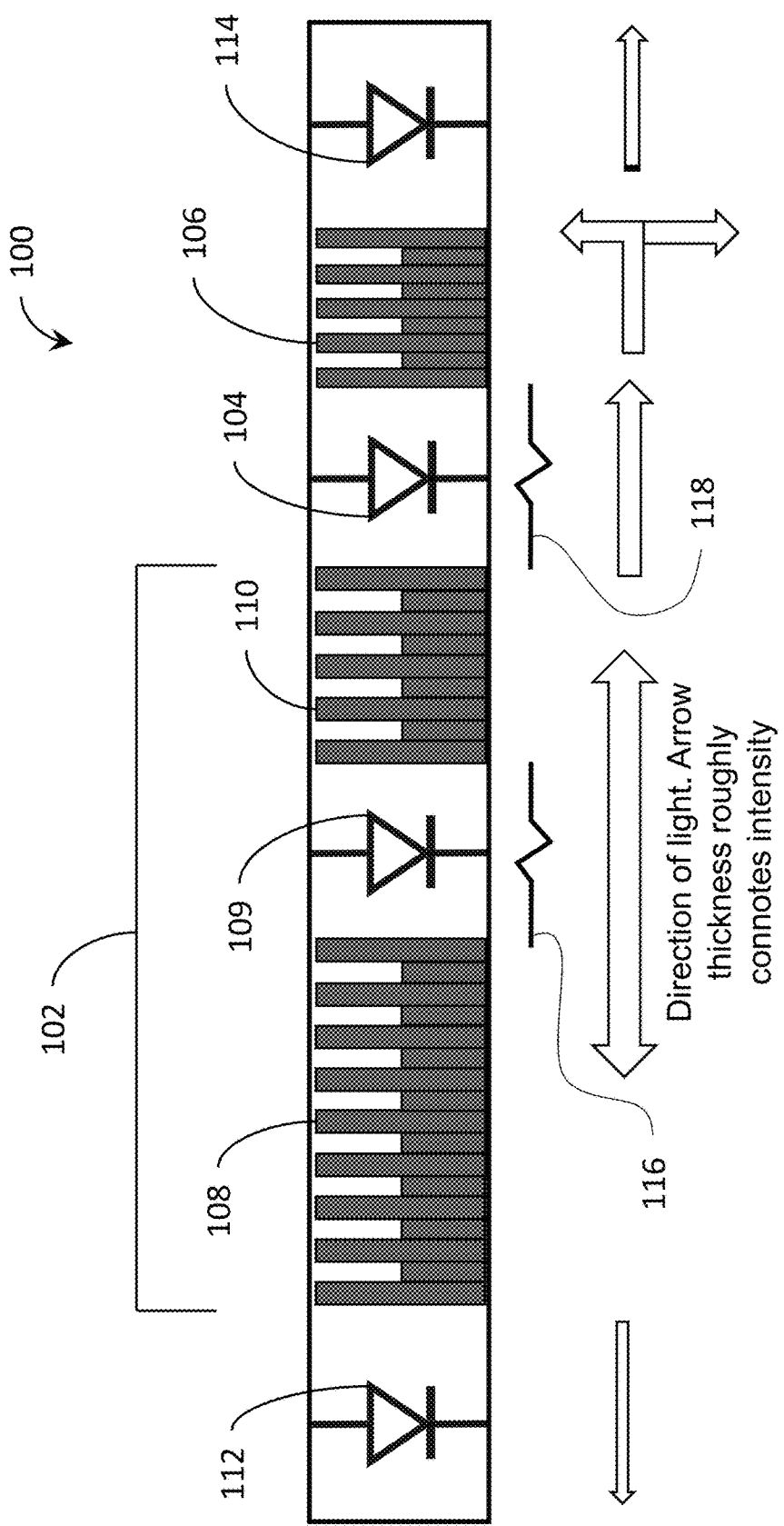
FIG. 1A is a block diagram illustrating a laser with an integrated electro-absorption modulator.

The present invention can be better understood by the following discussion of the manufacture and use of certain preferred embodiments. Like reference numerals are used to describe like parts in all figures of the drawings. The following detailed description of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the invention. The following detailed description is, therefore, not to be taken in a limiting sense. The scope of the invention is defined only by the appended claims, along with the full scope of equivalents to which such claims are entitled.

Figure 1B:
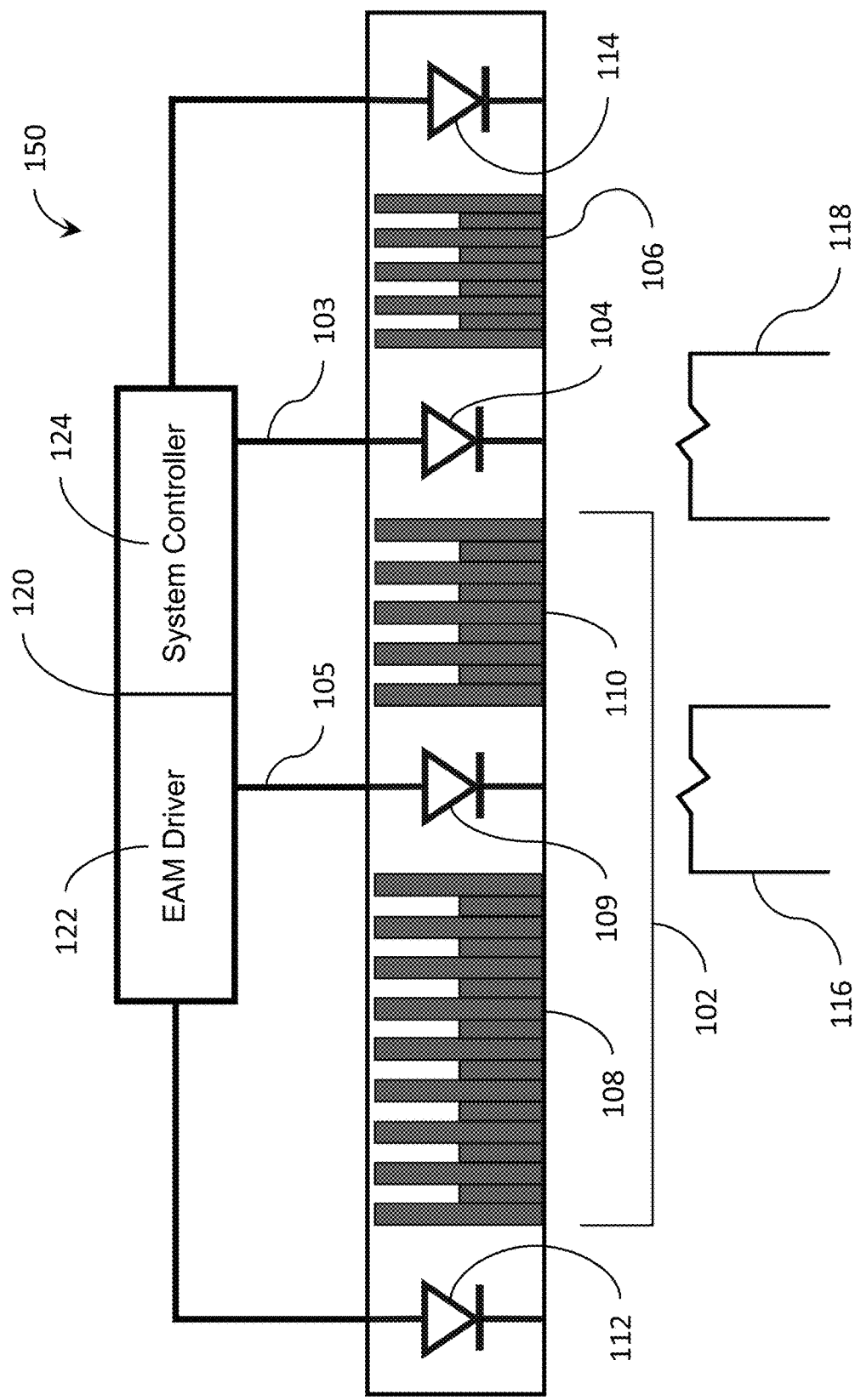
FIG. 1B is a block diagram illustrating a laser with an integrated electro-absorption modulator in a system with control circuit consisting of an EAM driver and system controller.
Figure 1C:
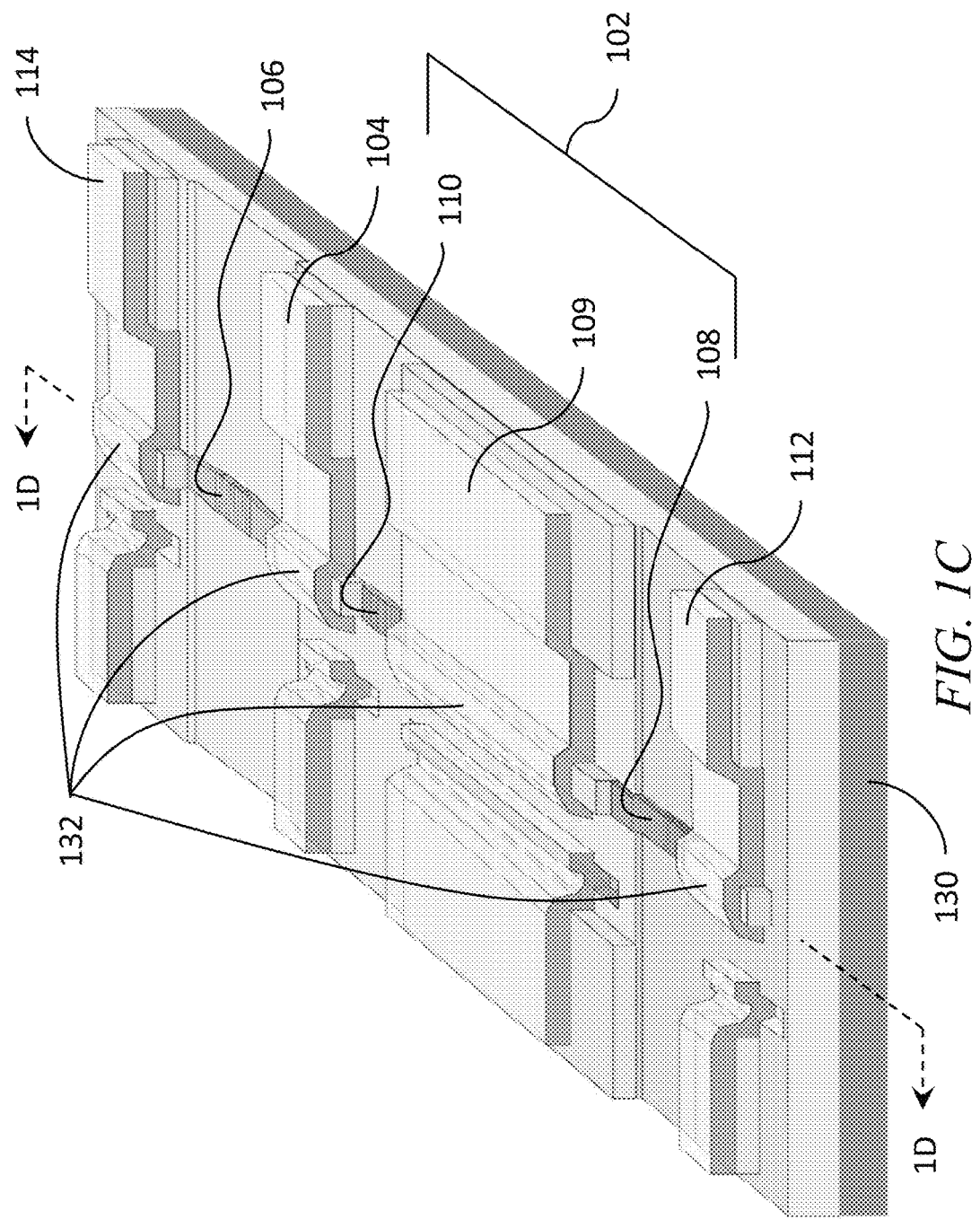
FIG. 1C is a three-dimensional view of the overall device with optional detectors at each end.
Figure 1D:
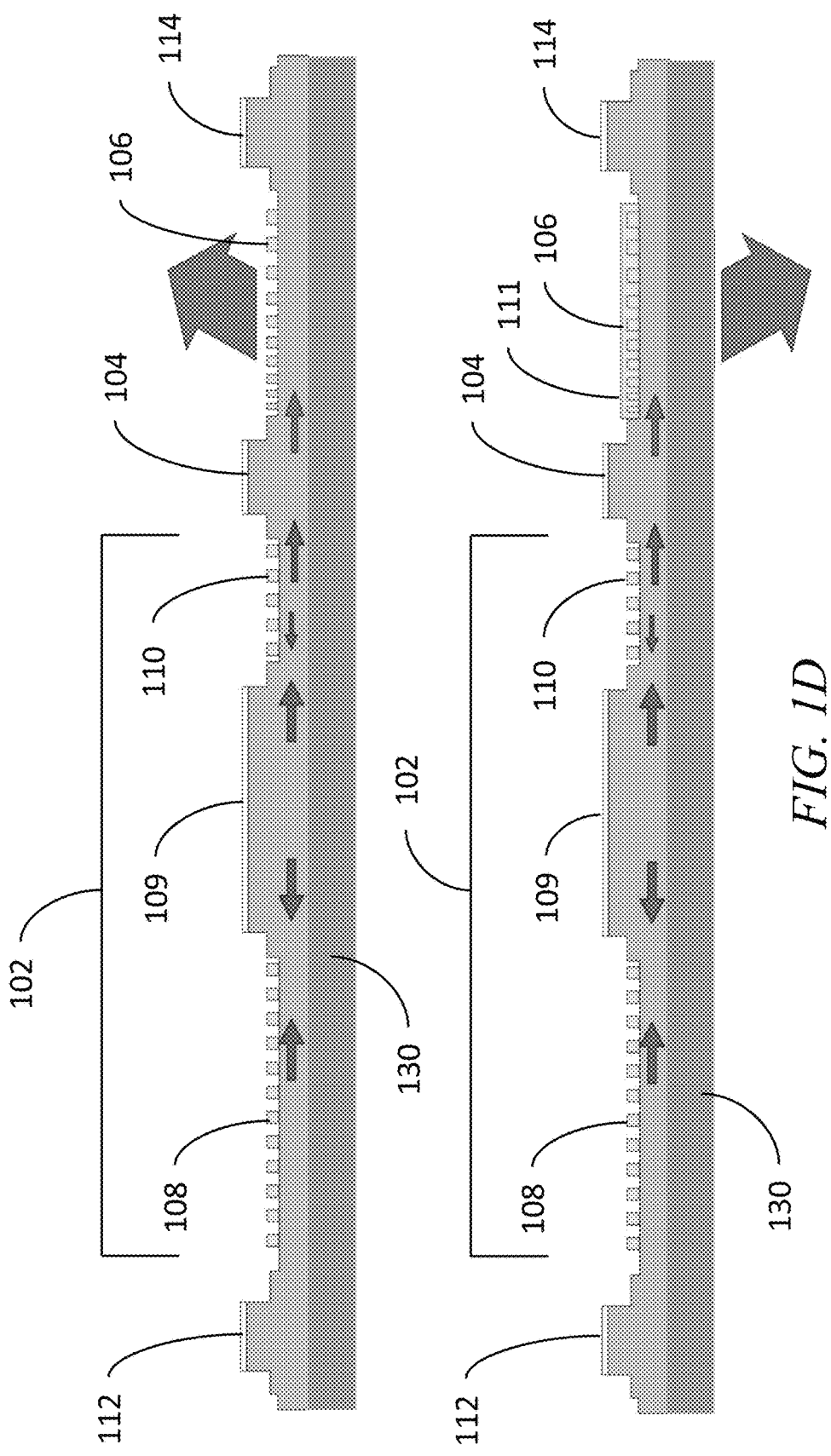
FIG. 1D are cross-sectional views of the overall device with optional detectors at each end.

FIG. 1A is one embodiment of a device 100 that includes a laser 102 with an integrated electro-absorption modulator 104 ("modulator" or "EAM"). The laser comprises a mirror 108, a mirror 110 and a laser gain section 109. The laser wavelength is operated and designed in a manner so that its primary wavelength tracks the spectral range of absorption modulation of the absorber over temperature. An output coupler 106 minimizes back reflection into the laser 102. FIG. 1B shows how the device 100 with the optional photodiodes 112 and 114 may be used in a system with control circuit 120 to optimize the drive to the laser 102 and the modulator based on the current through the modulator 104, and the currents through the photodiodes 112 and 114. FIG. 1C is a 3D diagram of the overall device 100 and FIG. 1D shows cross sections corresponding to the dashed line marked 1D in FIG. 1C of the device 100. The top cross section in 1D is for light emission from the top of the grating and the bottom cross section in 1D is for light emission through the substrate. The laser section is defined by mirrors at either end of a cavity and the pumped region of quantum wells in between. It is advantageous to use high reflectivity broad spectral bandwidth mirrors so that the threshold current may be kept small reducing the power consumption in cases where only low powers are needed such as in a local area network. The high spectral bandwidth allows the lasing wavelength to track the absorption spectrum of the modulator over temperature. In cases where high power is required the output mirror may be lower reflectivity.

High reflectivity broad spectral bandwidth mirrors can be achieved using any of many techniques, but probably the most production worthy is an etched DBR mirror. These high reflectivity mirrors allow the device to achieve a low threshold current even with a relatively long cavity. To allow the laser and modulator to track over temperature the laser must move smoothly in wavelength as the temperature is changed. The mode spacing of the laser can be relatively small, approximately 0.3 nm so that laser smoothly transitions its wavelength. The spectrum of such a laser typically encompasses 2-3 primary longitudinal modes in an envelope which peaks at the peak gain of the laser. As the temperature changes the laser smoothly transitions between modes. The spacing of these modes may be larger, ~0.6 nm, if low dispersion fiber is used allowing shorter devices.

The modulator section is formed adjacent to the laser section, but must have the top terminal nominally electrically isolated from the lasing section. The waveguide, which makes up the laser cavity is continued into the modulator section so that the mode structure in the modulator section is unchanged from that of the laser section. While the laser section is operated in the forward bias direction to achieve gain sufficient for lasing, the modulator section is operated primarily in the reverse bias direction, though some small forward bias may be used as long as the electric field in the modulator is sufficient to sweep out the generated carriers, and does not provide gain. The modulator section operates by switching between the low reverse bias state (can also be zero bias or slightly forward) to a high reverse bias state. For the wavefunction overlap method in the low bias state the overlap integral of the wavefunctions at the lasing wavelength is high so absorption is maximum. At the high bias state the wavefunctions have low overlap so the absorption is minimized. An exemplary aspect of this modulator is the high absorption that can be achieved. Using this high absorption the modulator section can be kept small which allows higher speed to be achieved due to both the lower capacitance and the reduced dimensions.

Alternately, the Stark shift can be used so that the absorption band edge is shifted back and forth across the lasing wavelength with reverse bias. In this case a higher reverse bias enhances absorption in contrast to the wavefunction overlap method. Many Stark shift modulators use the effect in the lower absorption region of the absorption spectrum, where this invention uses the effect in the strong absorption regime.

The laser 102 may be a Distributed Bragg Reflector ("DBR") laser using broad spectral response mirrors. The modulator 104 may use wavefunction overlap modulation to achieve a broader spectral range of operation and to enhance the tolerance of wavelength alignment between the laser 102 and the modulator 104 or it can use the standard band edge Stark shift. The quantum wells are designed so that the absorption spectrum aligns with the lasing wavelength and has a high peak absorption at the lasing wavelength. This can be done with both wavefunction overlap modulation and band edge modulation and is dependent on the specifics of the quantum well design. This results in a modulator 104 which has a high peak absorption coefficient allowing the modulator 104 to be short, and thus low capacitance and easy to drive at high data rates even in excess of 100 Gb/s. The output coupler 106 is a high efficiency grating output coupler, which minimizes back reflection into the laser 102, thereby preventing coupling of the intentionally modulated light with the relaxation oscillation of the laser. The output coupler 106 is specifically designed to emit light off axis to also prevent efficient back-coupling of light from downstream elements such as fiber faces. Depending on the details of the process, the light can either be emitted vertically up from the top surface, or through the substrate 130.

To make the modulator 104 and laser 102 work well together the quantum wells used for both are grown at the same time with the same design. The lasing peak of the laser is designed to match the absorption spectrum of the modulator and thus achieve superior tracking over temperature. This can be achieved using several techniques. The laser can be driven to operate at a wavelength substantially shorter than the absorption band edge of the modulator by using sufficiently high current density to achieve bandfilling, or the modulator can be heated to reduce its band edge slightly. This can be either through absorption of the laser light or a heater integrated or external to the device, or some combination thereof. If the laser light itself is used as the primary heater the light from the laser itself can be used to control the temperature. An elevated temperature can be achieved by simply having low thermal conductivity from the modulator section. All these techniques are relatively weak and most suitable for making fine adjustments to the spectral alignments of the laser and modulator. The most important and strongest method to achieve the matching of the modulator absorption spectrum with the laser is to design the device with some degree of Stark shift at the built in voltage so that the absorption band is at a sufficiently long wavelength with applied electric field. This is the simplest and most practical method.

The modulator 104 can use a standard Stark shift electroabsorption effect, but a method with more wavelength tolerance uses variation of overlap of the hole and electron wavefunctions. That is with more applied field the overlap of the wavefunctions can be reduced and thus the absorption can be reduced. This is a first order effect with absorption changing from full band to band absorption to a lower value as reverse bias is increased. Such a design uses a slight reduction in band edge at the zero bias condition, caused by the built in field and residual Stark shift to achieve the alignment of the laser wavelength with absorption spectrum of the modulator combined with reduction of the wavefunction overlap with increasing reverse bias to achieve modulation. Other methods described above can also be used in combination to achieve the alignment of the absorption spectrum with the lasing wavelength.

The absorption in the modulator 104 produces a current proportional to the absorbed light. This current is the sum of a DC component and an AC component related to the optical modulation of the light. This current, AC and/or DC, can be monitored by the EAM driver 122 and system controller 124 which make up the control circuit 120 and be used to adjust the driving conditions (DC bias 103 on the EAM 104, modulation amplitude on the EAM 104, rise and fall times of the modulating signal, temperature difference between the laser 102 and EAM 104, and the DC bias 105 on the laser 102) for the laser 102 and EAM 104 for an optimal eye diagram with the desired power and Optical Modulation Amplitude (OMA).

While the output coupler 106 is highly efficient, some light does get through. This can be detected with a photodiode 114 along the waveguide past the output coupler 106. This photodiode 114 can have its absorption spectrum adjusted with both applied bias and temperature relative to the active region by the system controller. The temperature can be adjusted using increased thermal impedance, a heater, applied voltage on the photodiode, or other means. The current through the photodiode 114 can be used by the drive electronics 120 to ascertain the quality of the eye diagram, as well as the power level to enable appropriate adjustments to the driving conditions: DC bias 103 on the EAM 104, modulation amplitude on the EAM 104, rise and fall times of the modulating signal, temperature difference between the laser 102 and EAM 104, and the DC bias 105 on the laser 102.

The photodiode 112 may be a rear facet photodiode used to measure the power of the laser so the laser can be adjusted as desired. These methods to control the output of the device 100 can be used in any combination and are not exclusive of each other.

Figure 2A:
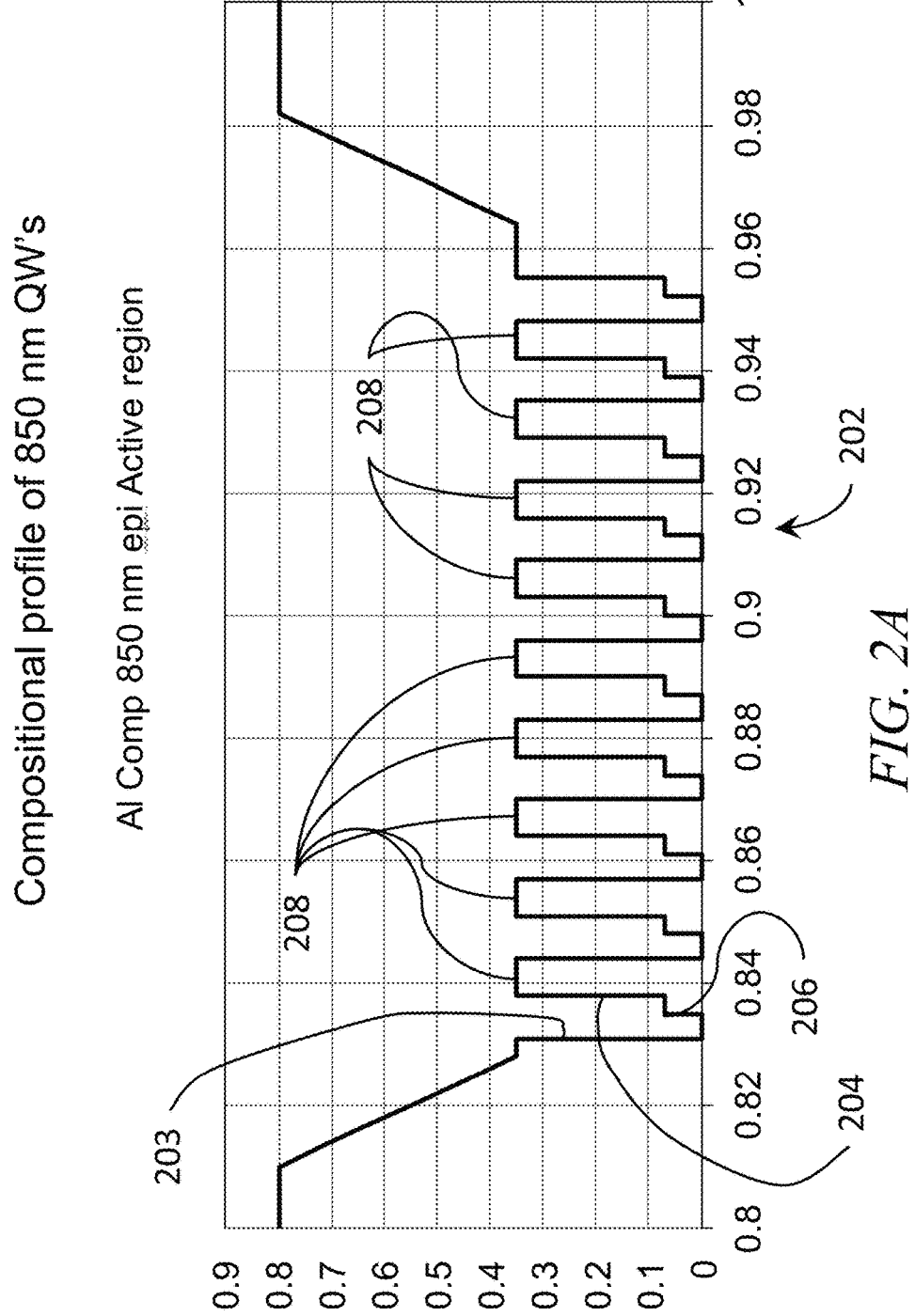
FIG. 2A is a graph depicting the compositional profile of the undoped active region for both the modulator and the laser for an 850 nm structure.
Figure 5A:
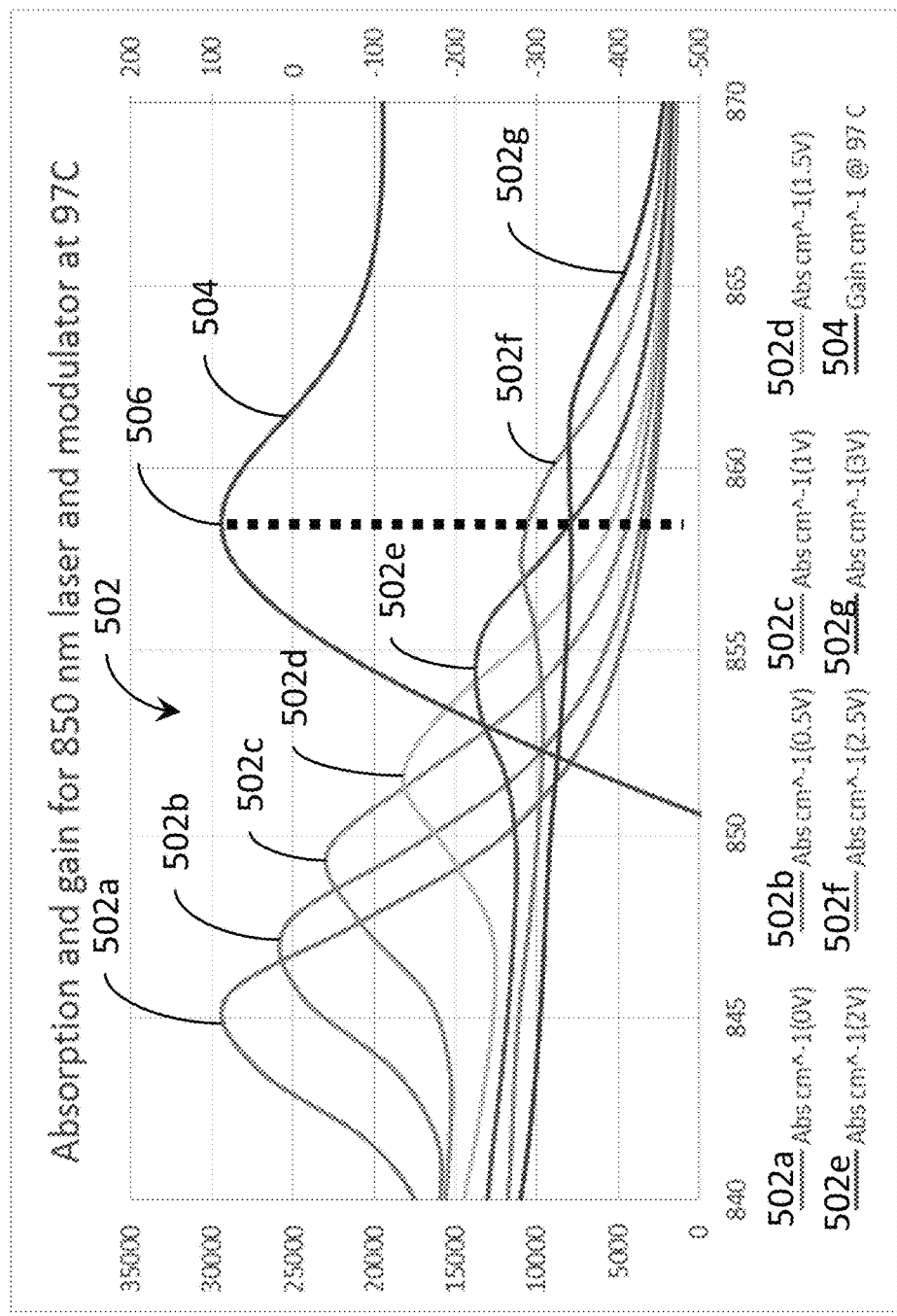
FIG. 5A is a graph depicting the absorption spectrum of the modulator as a function of applied bias along with the gain spectrum under the lasing condition of 97° C. for a 850 nm laser.
Figure 5B:
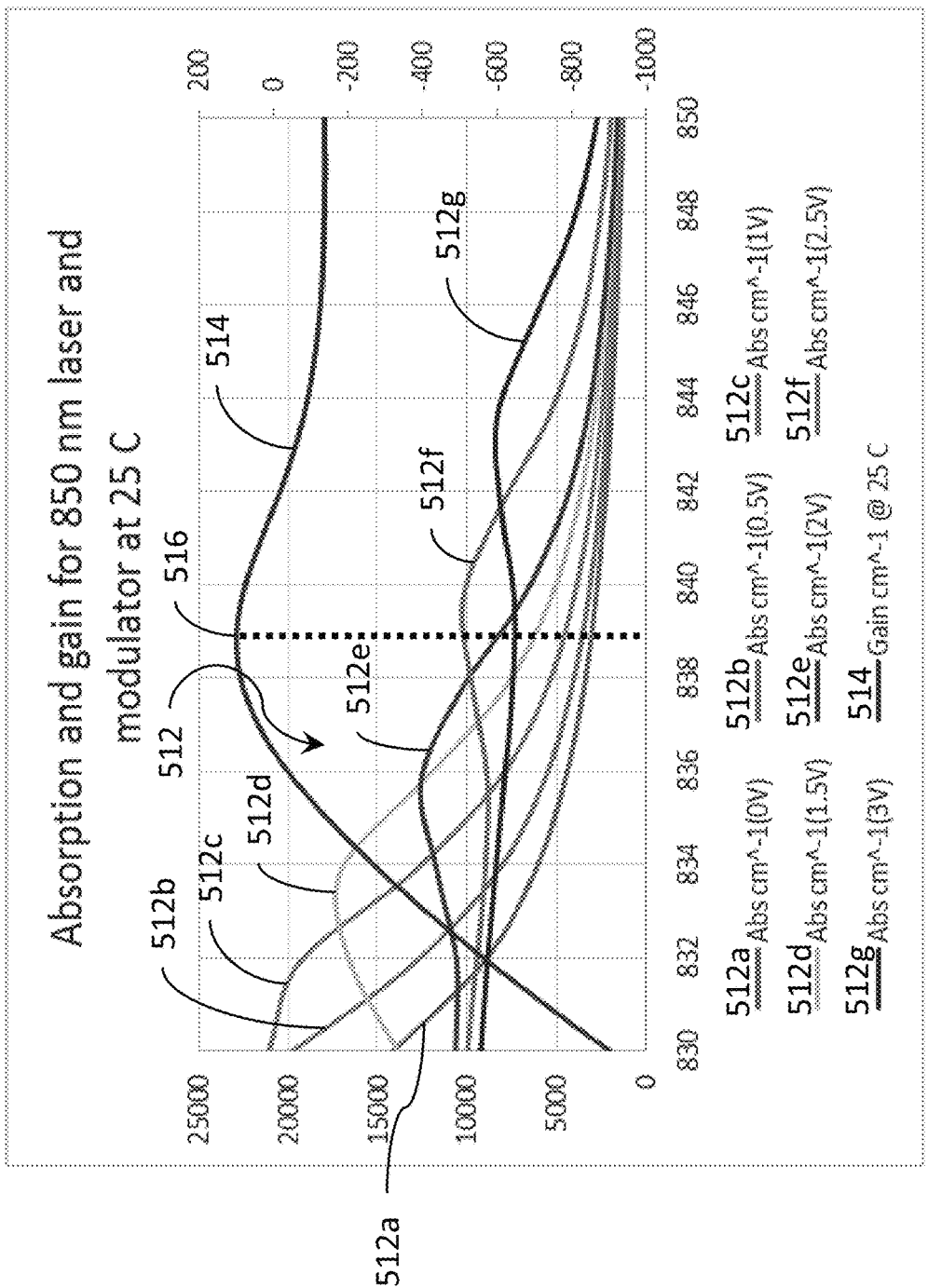
FIG. 5B is a graph depicting the absorption spectrum of the modulator as a function of applied bias along with the gain spectrum under the lasing condition of 25° C. for an 850 nm laser.
Figure 5C:
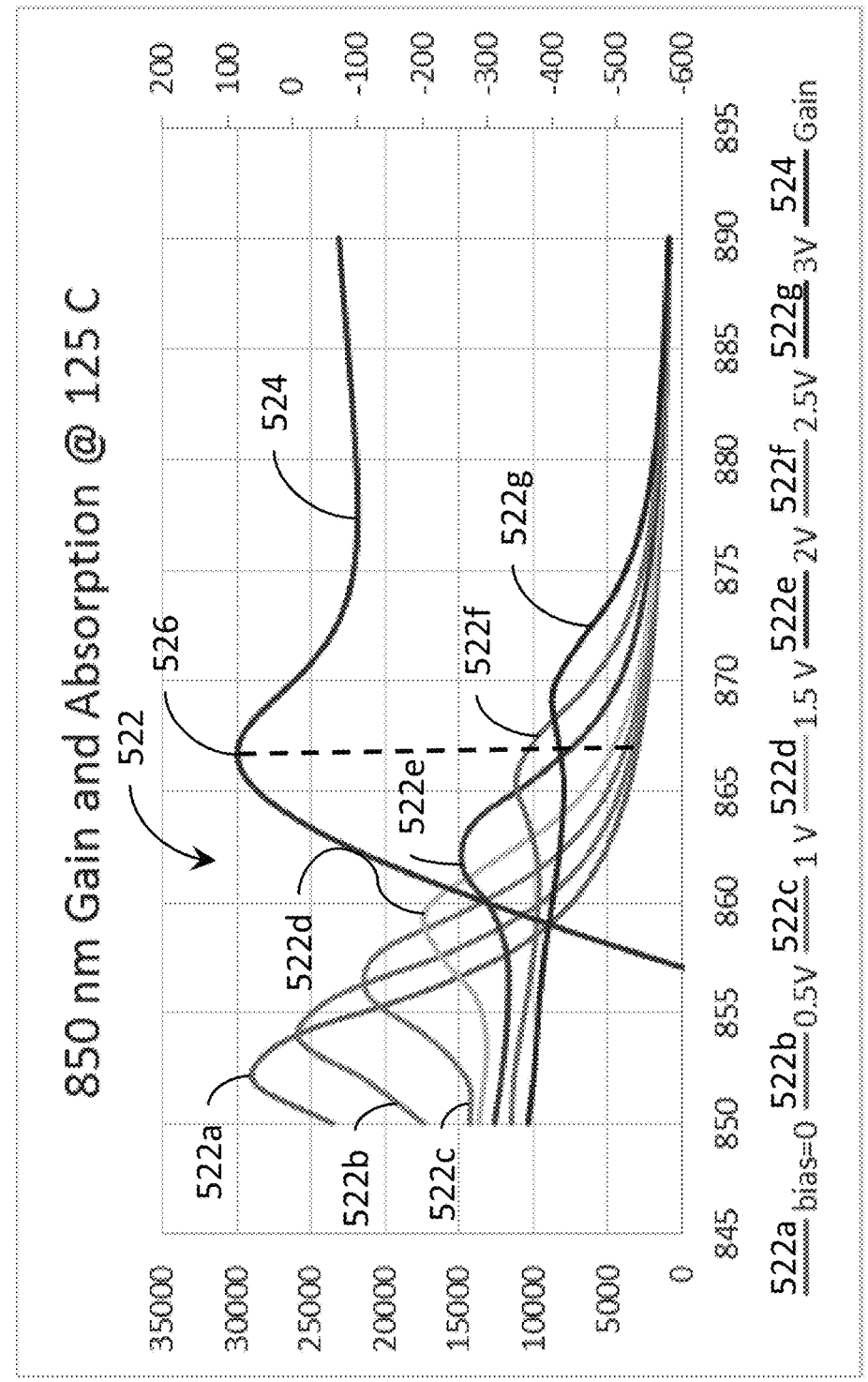
FIG. 5C is a graph depicting the absorption spectrum of the modulator as a function of applied bias along with the gain spectrum under the lasing condition of 125° C. for an 850 nm laser.

FIG. 2A is a graph depicting the active region composition for an 850 nm active region. Table 1 shows the epi design. The active region is made up of a series of quantum wells 202 which are asymmetric. In this case, it was found that asymmetric wells allowed the absorption spectrum to overlap the lasing wavelength 506, 516 as shown in FIGS. 5A, 5B and 5C. This applies to ramped compositions in the quantum wells as well as stepped compositions. The modulation for this modulator 104 as can be seen from FIG. 5A is primarily band edge modulation with the wavefunction modulation being a parasitic. The modulator 104 operates between a low reverse bias state and a high reverse state. In the low reverse bias state the lowest level electron wavefunctions and the highest energy hole wavefunctions (both light and/or heavy holes) reside substantially in the quantum wells 202 and have a high overlap integral between the hole and electron wavefunctions. This causes a high absorption in the spectral range defined by the energy difference between the maximum energy hole bands and the minimum energy electron bands, but in this case the absorption spectrum has little overlap with the lasing wavelength and the absorption is low. The low reverse bias state can be close to zero applied volts or even slightly forward biased, as long as the photogenerated minority carriers can be effectively swept out by the electric field. In the high bias state the overlap integral is reduced by the reduced overlap causing the minimum electron energy and maximum hole energy wavefunctions to have a reduced overlap integral reducing the absorption, however, the band edge shift causes a large increase in absorption at the lasing wavelength, despite the reduced wavefunction overlap acting as a parasitic. In this case the Stark shift is used so that the band edge shift is used as the method of modulation, and the variation in wavefunction overlap is a parasitic effect.

To optimally minimize the dimensions of the modulator to allow the highest speeds it is important that the modal dimensions in the direction perpendicular to the plane of the quantum wells (vertical) be minimized to increase the quantum well confinement factor. As used herein, quantum well confinement factor means the ratio of the optical intensity in the quantum wells to the total optical intensity. This also reduces the lasing threshold of the laser section. One method to keep the vertical dimension of the mode small is to use a highly confined waveguide such that the index of refraction of the cladding layers is substantially less than that of the active region. This both reduces threshold current and enhances the performance of the modulator, by increasing the quantum well confinement factor in both cases. One other aspect to maximize the quantum well confinement factor is the thickness of the active region. A substantially thick active region is useful to improve the quantum well confinement factor in both the laser and modulator, but the required more quantum wells in the laser section increases threshold. This is a tradeoff made in the design depending on the desired performance parameters of the system.

To minimize difficulties with back reflection from the modulator section into the laser the waveguide of the laser section is nominally continued into the modulator section and the modulator section is nominally non resonant. It could be made resonant, but because of the problems with back reflection being nominally non resonant is preferred.

The output of the modulator section feeds into a waveguide section containing the vertical output coupler. The output coupler is used in a condition where back reflection into the modulator and thus the laser is minimized. This is important to avoid having the modulator couple strongly to the relaxation oscillation of the laser, which would introduce pattern dependent eye closure on the resulting eye diagram. The maximum reflectivity from the output coupler needs to be less than half the reflectivity of the second mirror, and optimally less than one fifth the reflectivity of the second mirror. There are many designs for output couplers, which can achieve high transmission and low reflection. One of these is an enhanced coupling strength (ECS) second order grating outcoupler that employs a low index liner region between two higher index regions. This ECS grating is covered in patent application (Evans et al., "Enhanced Coupling Strength Gratings," US Patent Application Publication US 2015/0063753 A1, Mar. 5, 2015).

It is important that the control circuit 120 is able to monitor the quality of modulation. One option for this is to monitor dynamically the current in the modulator section 104. The current is directly related to the light absorption and thus the modulation. Another method is to add a photodiode 114 to the waveguide past the grating output coupler. Since the grating output coupler is not 100% efficient some of the modulated light will reach the photodiode section where it can be detected and the power and eye opening can be feed back to the drive electronics allowing optimization of the driving conditions. In the photodiode section, the applied voltage, and the local temperature difference from the active region may be used to adjust the absorption of this section. Again this temperature difference can be accomplished with a local heater, adjusted thermal impedance, the applied bias or other means.

An important aspect of this design is the tracking of the lasing wavelength 506, 516, 526 and the absorption spectrum over temperature as a comparison of FIGS. 5A, 5B and 5C illustrate. This is profoundly useful because it means no temperature control is needed, though the relative temperature between the modulator 104 and laser 102 can be controlled as discussed elsewhere to make fine adjustments.

TABLE 1

850 nm design

| Table 1, 850 nm design | Al composition of AlGaAs | Thickness(um) | Doping Cm^-3 | |
|---|---|---|---|---|
| Cap | 0 | .08 | 5e19P | |
| P clad | .8 | .8 | 5e17P | |
| SCH | 0.35-0.8 ramp | .018 | 0-5e17P ramp | |
| Outer Barrier | .35 | .009 | 0 | |
| Well1 | .07 | .003 | 0 | Loop 10 |
| Well2 | 0 | .004 | 0 | |
| Barrier | .35 | .006 | 0 | End loop |
| SCH | .8-.35 | .018 | 5e17n-0 | |
| Clad | .8 | .8 | 5e17n | |
|  | 0-.8 | .02 | 3e18n | |
| Substrate GaAs | 0 | — | nsub | |

Figure 2B:
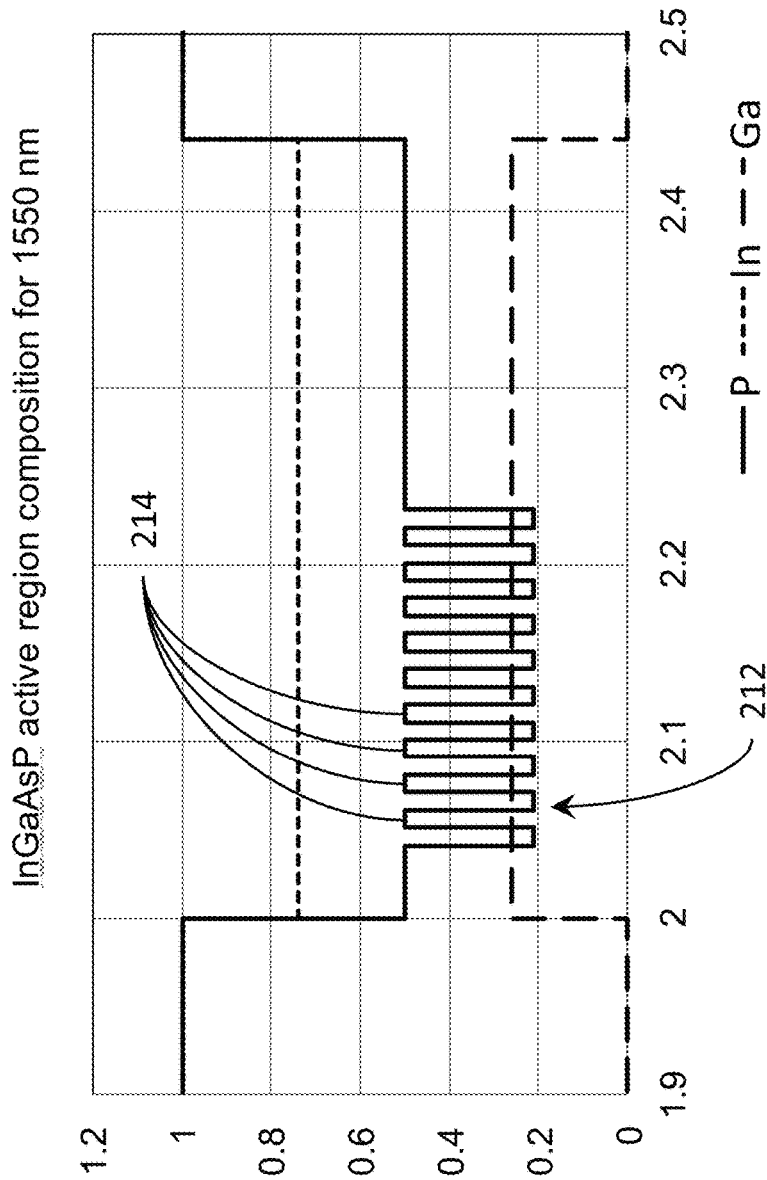
FIG. 2B is a graph depicting the compositional profile of the undoped active region for both the modulator and the laser for a 1550 nm structure.

FIG. 2B and the structure in table 2, and table 3 refer to an embodiment with a 1550 nm laser and modulator combination. In this case, by choosing slightly wide quantum wells and optimized barriers as there are regions at low reverse bias (0-1V), FIG. 6a, b, c, d where band edge modulation can be used and the structure is very sensitive to applied voltage, and a region of higher bias where wavefunction overlap modulation can be used (1-2V) and the absorption change is quite sensitive to applied voltage. Depending on the details of the quantum well design, the alignment of the absorption and lasing spectra can be achieved. Either band edge modulation or wavefunction overlap modulation can be used. These can sometimes both be used on the same structure in different bias ranges. There are most likely many shapes of quantum wells, which can be used to meet these requirements. Standard quantum wells usually need some modification in order to align the absorption spectra and lasing wavelength at the same temperature so that high absorption and large sensitivity to the applied field can be achieved. The common problem is that the lasing occurs at a substantially longer wavelength than the absorption. This is overcome with the help of the built in voltage, using the Stark shift to lower the absorption edge close to or past the lasing energy. Structures with enhanced Stark shift are useful for this. For example at 1550 nm all that was needed was a slight widening of the well versus the original design as well as a reduction in indium to maintain the wavelength. It has also been found that a slight tilting of the wells is can be advantageous for some conditions. If the band edge absorption is lowered past the lasing energy at low reverse bias, then wavefunction overlap is the method of choice, and if the band edge absorption is above the lasing energy the standard Stark shift is chosen so that added reverse bias reduces the band edge energy below the lasing energy and strong absorption occurs, but as can be seen, depending on the bias either may be used in some cases. In addition, one further adjustment option is a slight forward bias of the junction as the fields in the active region are still in the reverse bias direction able to sweep out the generated carriers.

Once again it is important to point out that the absorption and lasing wavelength track over temperature. Fine adjustments to the temperature difference again can be made using methods discussed elsewhere.

The overall device is shown in three dimensions in FIG. 1C and in cross sections in FIG. 1D. The required elements are the laser 102 with broad band mirrors 108 and 110, the EAM 104, and a low back reflection output coupler 106. The rear mirror 100 on the laser 102 should be high reflectivity, which can (for example and as shown here) be accomplished using a DBR. The reason for high reflectivity is simply to keep the threshold current low to enhance the overall efficiency of the system. The gain region of the laser has a few different aspects that are important. If the fiber being used is not low dispersion than the modal spacing of the laser 102 should be small enough so that the splitting between modes does not cause excessive spectral bandwidth and thus chromatic dispersion in the fiber. A modal spacing similar to or less than the RMS spectral bandwidth limit of the system is suitable. With low chromatic dispersion fiber there is more freedom in laser design and the length of the laser 102 can be a length that minimizes threshold current. The thickness of the active region is thick to maximize the quantum well confinement factor. The optical confinement should be high again to maximize the quantum well confinement factor. A high quantum well confinement factor maximizes the effect of the EAM 104 and a highly confining structure minimizes the threshold current. The front mirror 110 of the laser should have a reflectivity such that the slope efficiency is in an efficient range. The reflectivity of the rear mirror 108 should be greater than 75% and the reflectivity of the front mirror 110 could be in the range of 1-50%. Typically the rear mirror has a reflectivity greater than 95%. The length of the EAM 104 is chosen to optimize various aspects. The length is kept short to minimize capacitance and electrical transmission delays. It must be long enough to achieve a sufficient extinction ratio, ER but excess length reduces the total transmitted power. The thickness of the active region of the EAM 104 is maximized to enhance optical confinement. The optical confinement provided by index delta is maximized. The limitations on the thickness of the active region is the ability to achieve sufficient fields with modulating amplitude limited to less than 3 volts and the increase in threshold current. The other aspects are described below.

Referring back to FIG. 1D, the output coupler 106 can be designed using several varied forms, but it is required that the back reflection into the system be relatively low to avoid excess coupling of modulated light into the laser. This can be achieved with combinations of mirrors and AR coatings, or a second order grating. A grating is shown here. The light may either be directed vertically from the surface or through the substrate 130. The light may be directed off vertical to avoid back coupling from the fiber face or a vortex lens may be used. The fiber can be single mode, or multimode and low or high chromatic dispersion depending on the distance requirements of the higher level system. A reflective coating 111 is deposited over the output coupler 106 to direct all the laser light downward through the substrate. The reflective coating 111 may be made from a reflective material such as gold.

The active region of a modulator using wavefunction overlap must tightly confine both the electron and hole wavefunction so that there is substantial overlap in the transition matrix integral at zero bias or close to it (built in voltage), and at high reverse bias the transition matrix integral must be small to achieve low absorption. This is achieved by having the hole and electron wavefunctions no longer be confined only to the wells or to the same section of the wells at high reverse bias. The field separates the wavefunctions in opposite directions reducing their overlap.

The active region of the laser and the modulator use the same design, and as such must be made to work with both the modulator and the laser. In both cases each device benefits by a strong overlap of the optical field with the quantum wells. This is achieved using a large index of refraction difference between the cladding and the active region. Whether the mode is TE or TM depends on which polarization couples to the gain of the laser section best. Likewise, since gain and absorption are really different manifestations of the same fundamental process the choice of TE or TM polarization made by the laser will be the optimal choice also for the absorber.

The polarization, TE or TM is chosen by the laser as the polarization with the lowest threshold. The work herein has used situations where TE polarizations are expected. For these EAM active regions TE polarization works the best. If a laser active region, which prefers TM is used then TM will automatically work the best for the EAM section because emission and absorption are fundamentally the same physical process.

The device may also contain photodiodes 112 and 114 at both ends and the heaters 116 and 118. The rear facet photodiode 112 can be used to monitor the input power, and the output photodiode 114 can be used to monitor the modulation and power. The heaters can be used to fine tune relative temperatures to optimize performance.

The overall system diagram, FIG. 1*b*, shows a controller circuit 120 that drives the EAM 104 and provides a DC bias for the laser 102. It also optionally can sense the AC and DC current in both the EAM 104, and the optional output photodiode 114. It provides bias to achieve suitable absorption on both photodiodes 112 and 114, and can sense the power of the laser 102 with the rear facet photodiode 112 to allow power control of the laser. The output coupler 106 is highly efficient, and the rear laser mirror is also, so the current in the photodiodes 112 and 114 will not be high.

In the overall system the AC elements, the EAM driver 122, and the output photodiode 114, should ideally be isolated from the other elements for both the return and signal lines, though a common return may be adequate.

Referring back to FIG. 1C (in which a three-dimensional view of the laser with an integrated modulator is shown) and FIG. 1D (which shows cross-sectional views of the device), a main consideration in designing a distributed Bragg reflector (DBR) laser and a grating output coupler integrated with a laser or other photonic components, such as electro-absorption modulators and detectors, is the mode mismatch between a) the laser region and the transition region to the grating; b) the transition region and the grating region; and c) between the laser region and grating region. Note that for the proposed device, the laser 102, modulator 104, and the detector sections 112 and 114 have the same index profile and thus essentially the same mode profiles as the laser section. As a result, the calculated modal overlaps and resulting losses for each component will be the same as that calculated for the laser section.

TABLE 2

Thick 1550 nm structure

| Table 2, Thick 1550 nm structure | Material Index | Composition | Doping/cm^3 | Thickness (um) |
|---|---|---|---|---|
| Air | 1 | | | — |
| Cap | 3.62525 | InGaAs | 1e19P | 0.100 |
| P-clad | 3.16492 | InP | 5e17P | 2 |
| Space for grating | 3.35110 | $In_{0.74}Ga_{0.26}As_{0.5}P_{0.5}$ | 5e17P | 0.2 |
| SCH | 3.35110 | $In_{0.74}Ga_{0.26}As_{0.5}P_{0.5}$ | | 0.041* |
| 9x barriers | 3.35110 | $In_{0.74}Ga_{0.26}As_{0.5}P_{0.5}$ | 0 | 0.01 |
| 10x QWs | 3.50636 | $In_{0.74}Ga_{0.26}As_{0.79}P_{0.21}$ | 0 | 0.01 |
| SCH | 3.35110 | $In_{0.74}Ga_{0.26}As_{0.5}P_{0.5}$ | 1e17n ramping to 0 | 0.041* |
| N substrate | 3.16492 | InP | 5e17n | — |

TABLE 3

"Thin" 1550 nm structure

| Table 3 "Thin" 1550 nm structure | Material Index | Composition | Doping/cm^3 | Thickness (um) |
|---|---|---|---|---|
| Air | 1 | | | — |
| Cap | 3.62525 | InGaAs | 1e19P | 0.100 |
| P-clad | 3.16492 | InP | 5e17P | 2 |
| SCH | 3.35110 | $In_{0.74}Ga_{0.26}As_{0.5}P_{0.5}$ | | 0.041* |
| 9x barriers | 3.35110 | $In_{0.74}Ga_{0.26}As_{0.5}P_{0.5}$ | 0 | 0.01 |
| 10x QWs | 3.50636 | $In_{0.74}Ga_{0.26}As_{0.79}P_{0.21}$ | 0 | 0.01 |
| SCH | 3.35110 | $In_{0.74}Ga_{0.26}As_{0.5}P_{0.5}$ | 1e17n ramping to 0 | 0.041* |
| N substrate | 3.16492 | InP | 5e17n | — |

Referring back to FIGS. 2A and 2B, which are graphs depicting the compositional profiles for the active region of an 850 nm laser and a 1550 nm laser respectively. For the 850 nm laser using tilted quantum wells 202 allows the increased Stark shift at zero bias required to bring the high absorption portion of the curves 502 into a region where they match up with the laser light emission. In the 1550 nm laser, the same was accomplished by simply widening the quantum wells 212 and decreasing the indium in the well slightly. The wider quantum wells 212 allow more Stark shift at the built in voltage causing absorption curves 602 with relatively high absorption, which could be modified substantially with applied bias at the lasing wavelength 606. It has also been found that a slight tilt in the 1550 nm quantum wells can be used to adjust the properties somewhat for example to improve sensitivity to applied bias.

Figure 3:
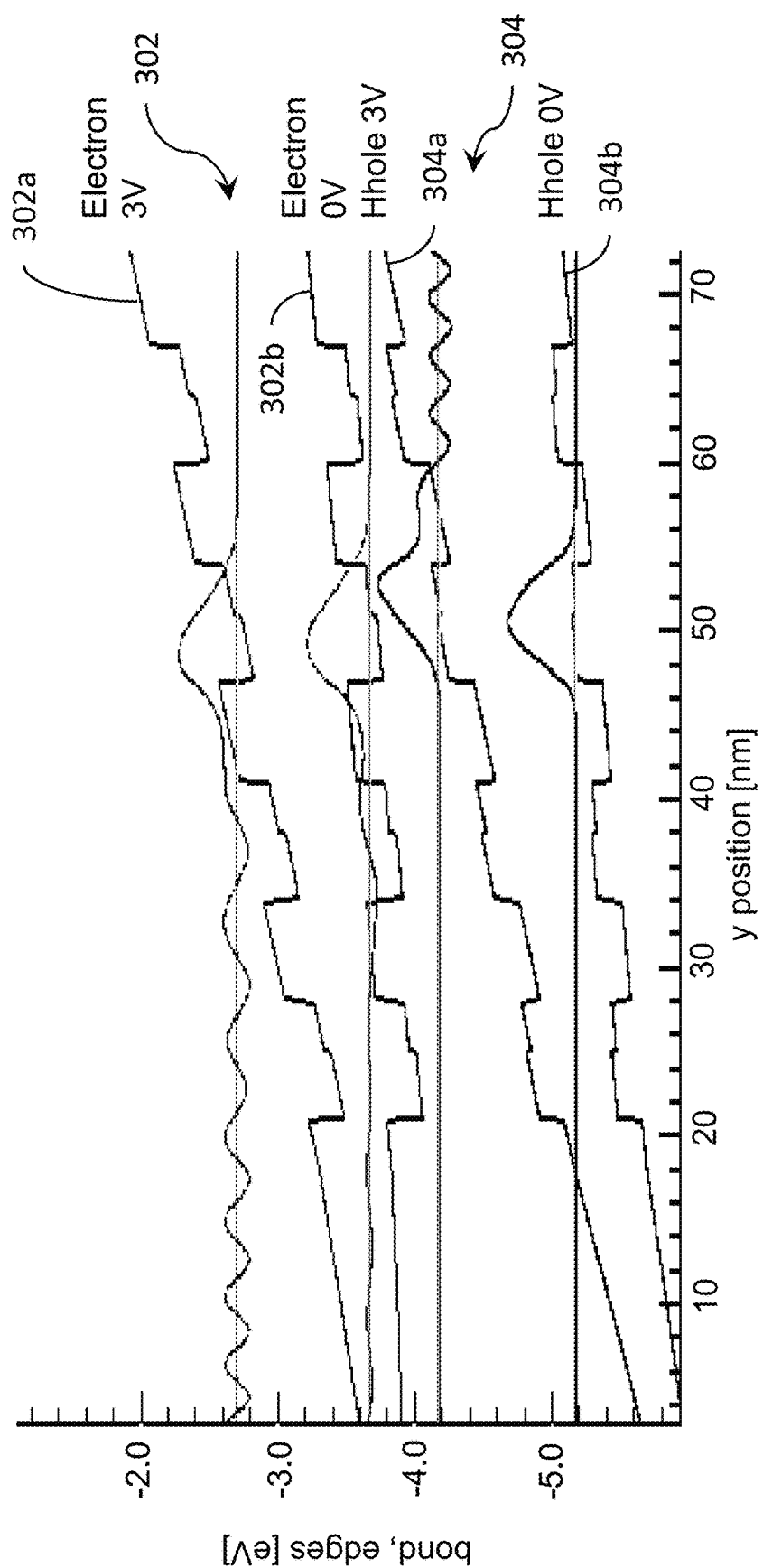
FIG. 3 is a graph depicting the change in the wavefunctions as a function of applied reverse bias for an 850 nm modulator.
Figure 4:
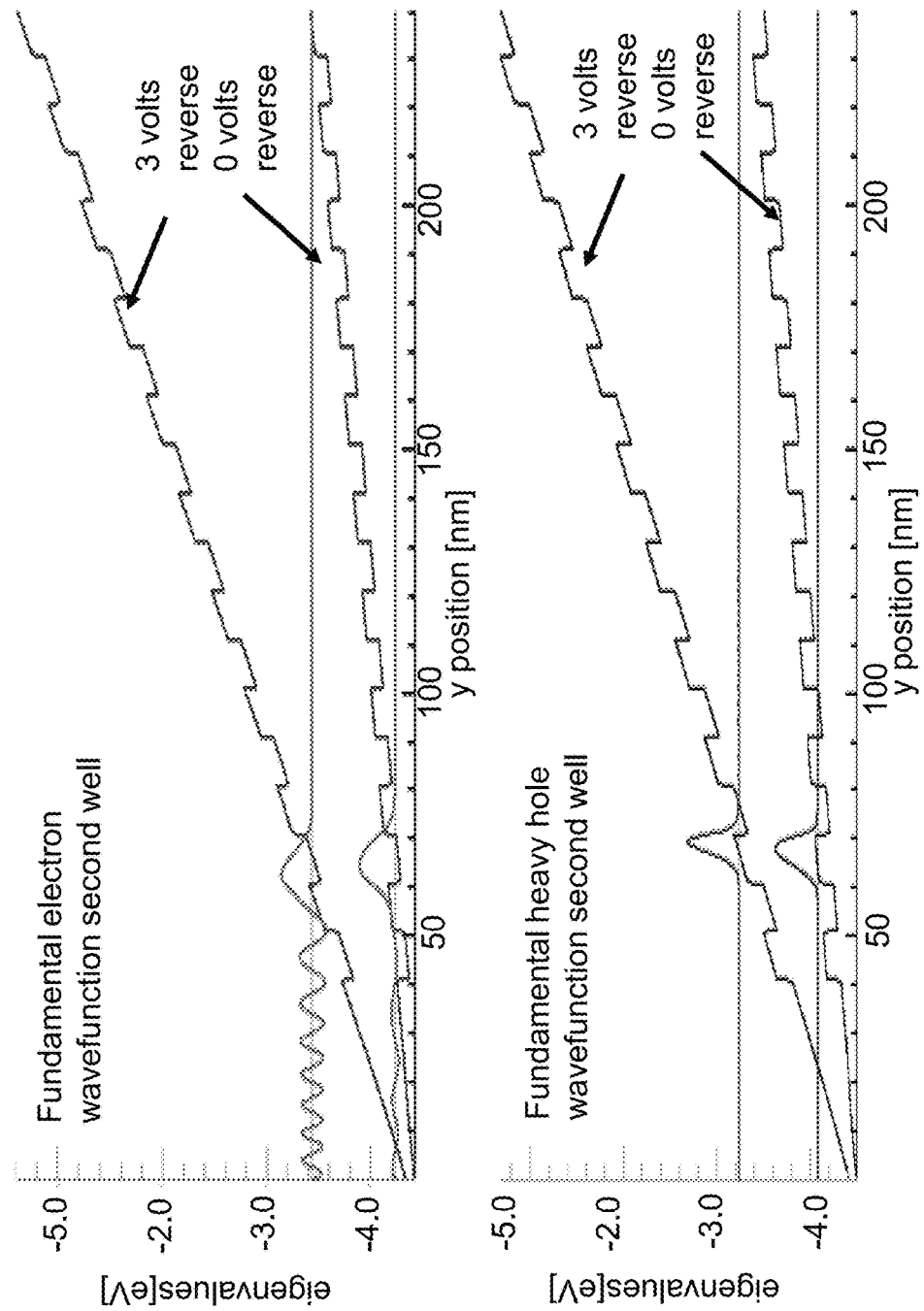
FIG. 4 is a graph depicting the change in the wavefunctions as a function of applied reverse bias for a 1550 nm modulator.

FIG. 3 is a graph depicting the change in the wavefunctions as a function of applied reverse bias for an 850 nm modulator. Note at zero reverse bias with just the built in field, the heavy hole wavefunctions 304 and electron wavefunctions 302 exhibit a lot of overlap. The substantial confinement at low reverse bias results in a high overlap integral and thus a high absorption coefficient though this absorption in not aligned with the lasing wavelength. At high bias (3V) the electron wavefunction 302a moves to the left and the hole wavefunction 304a moves to the right, however there remains reasonable overlap. As can be seen in FIG. 5A, the band edge absorption moves to a longer wavelength 502g than the lasing wavelength 506, which occurs at the peak of the gain curve 504.

FIG. 5A-C are graphs depicting the absorption spectrum of the modulator as a function of applied bias along with the gain spectrum under the lasing condition for a 850 nm laser at 97° C., 25° C. and 125° C. respectively. The graphs illustrate the absorption curves 502, 512 and 522 in the EAM of the quantum wells 202 and the gain curves 504, 514 and 524 at lasing for the 850 nm design. Comparing the graphs for 25° C. and 125° C. the spectra are suitably matched to provide the ability to have a large modulation of the absorption coefficient with the driving voltage at the lasing wavelengths 506 516 526 over a broad temperature range. The temperature range of 25° C. to 125° C. is a very useful temperature range for high-speed data transmission applications that includes those found in data centers, It is expected that a wider temperature range than shown here is easily achievable. Note also that this active region is most appropriate for the standard Stark shift method where the band edge energy is reduced with increasing reverse bias.

Figure 5D:
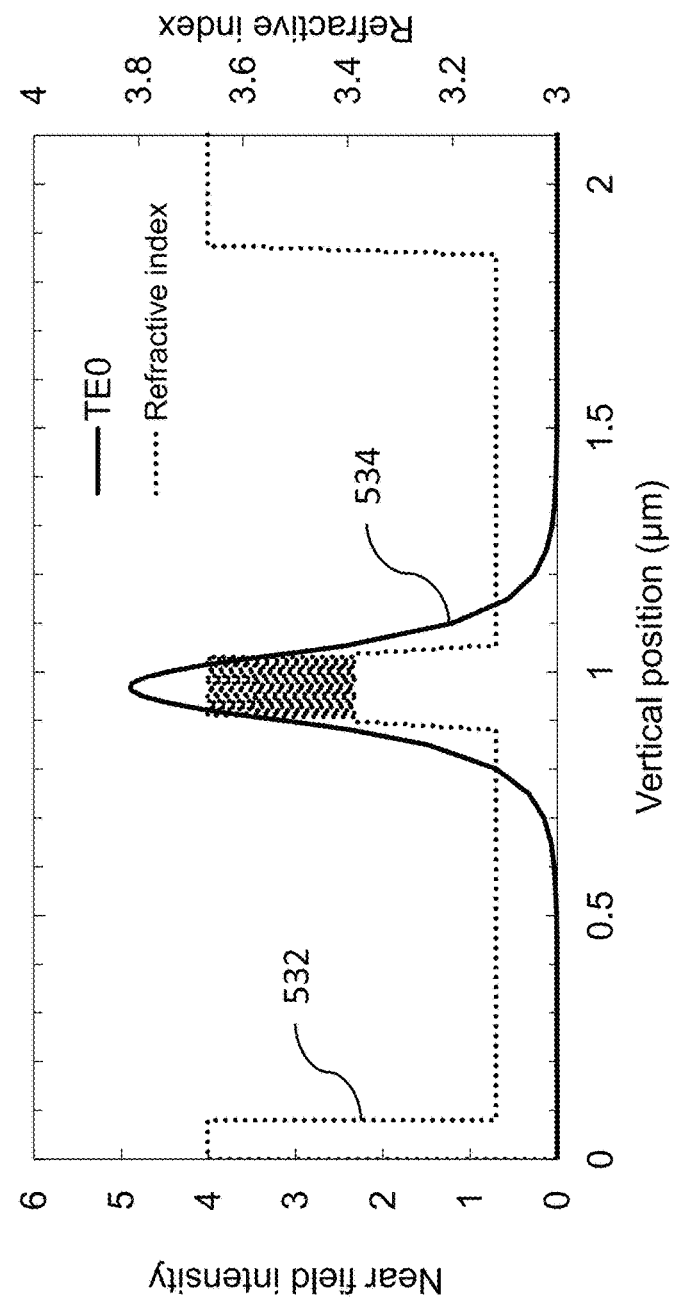
FIG. 5D is a graph depicting the optical mode for an 850 nm structure.

FIG. 5D is a graph depicting the optical mode for an 850 nm structure and FIG. 5E is a table depicting the quantum well confinement factor calculation results for an 850 nm structure. With the optical overlap factor for this structure calculated to be 0.304 (542 in FIG. 5E) and, the very high absorptions available, and the substantial ratio of peak absorption to minimum absorption at the lasing wavelength, an extinction ratio, ER, of 6 db is achievable at only a 5 um length of the EAM though higher ER's can be achieved at longer lengths. This means the capacitance to drive is very small and transmission delays along the length of the EAM are insignificant, allowing for very high speed modulation in excess of 100 Gb/s and the energy to drive the modulator is very small giving a low energy per bit. Note also that the wavelength of the device can be tuned according to temperature as shown in FIGS. 5A-5C, which is useful in WDM of CWDM applications. That is instead of being used over a wide temperature range, if the temperature is controlled a particular wavelength can be selected for that device. The temperature control can be made using various combinations of heating effects such as an external temperature controller, laser current, on board heaters, EAM bias etc. as discussed before. This makes it useful as a laser in WDM or CWDM applications.

FIGS. 6A-6D show a similar set of absorption and gain curves as FIGS. 5A-C except that they apply to the 1550 nm design. There are two slightly different embodiments considered, the thick structure as depicted in table 2 and FIG. 6E and the thin structure as depicted in table 3. FIGS. 6A-6D demonstrate operation of the device over the full military temperature range of −55° C. to 125° C., all with substantial peak absorption at the lasing wavelength 606, 616, 626, 636.

Figure 6A:
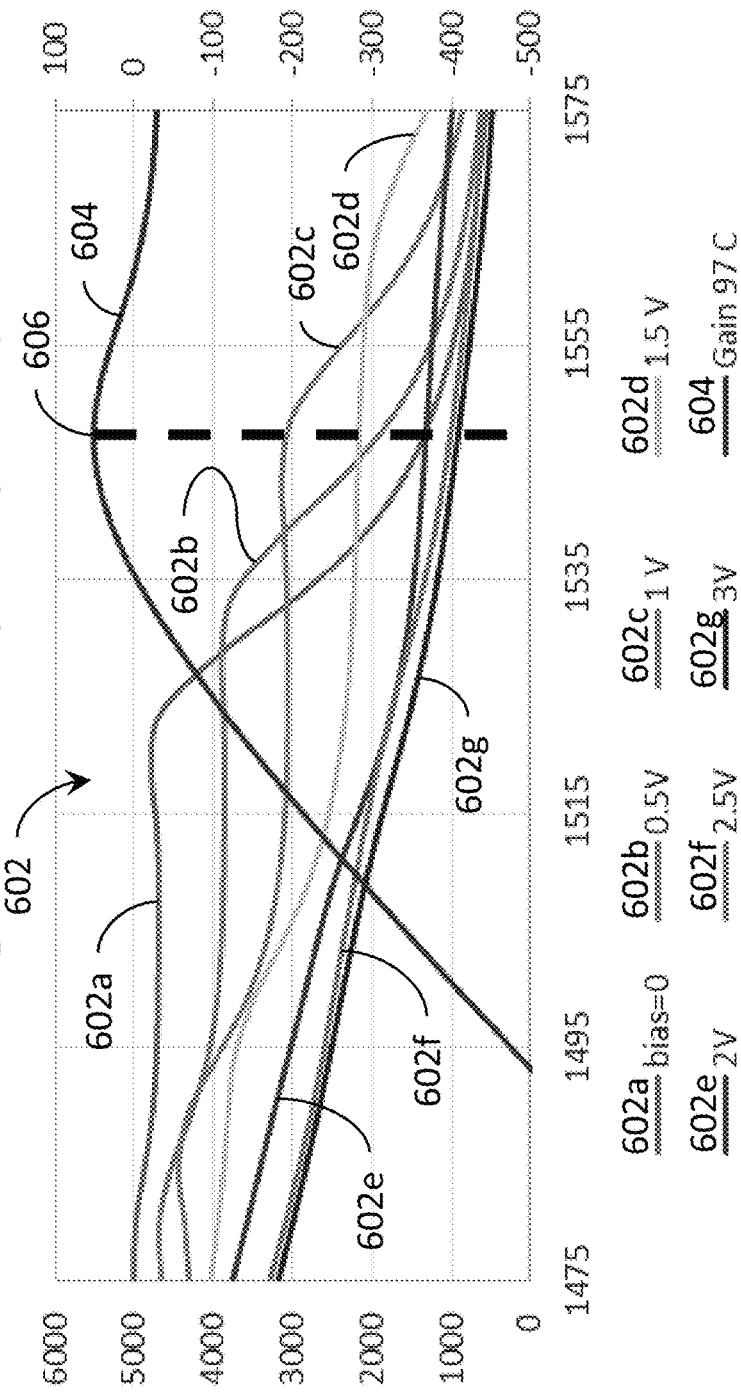
FIG. 6A is a graph depicting the absorption spectrum of the modulator as a function of applied bias along with the gain spectrum under the lasing condition at 97 C for a 1550 nm laser.
Figure 6B:
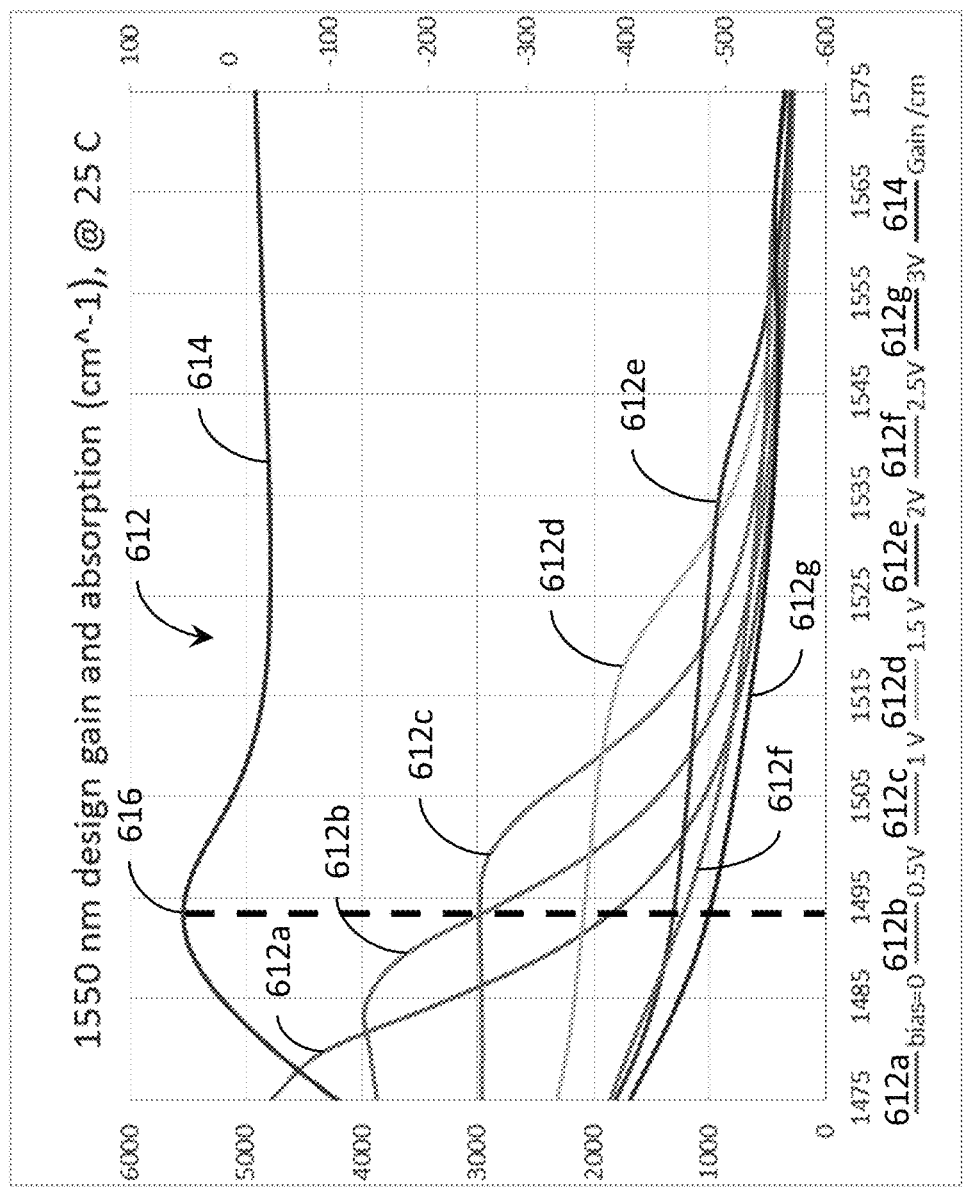
FIG. 6B is a graph depicting the absorption spectrum of the modulator as a function of applied bias along with the gain spectrum under the lasing condition at 25 C for a 1550 nm laser.
Figure 6D:
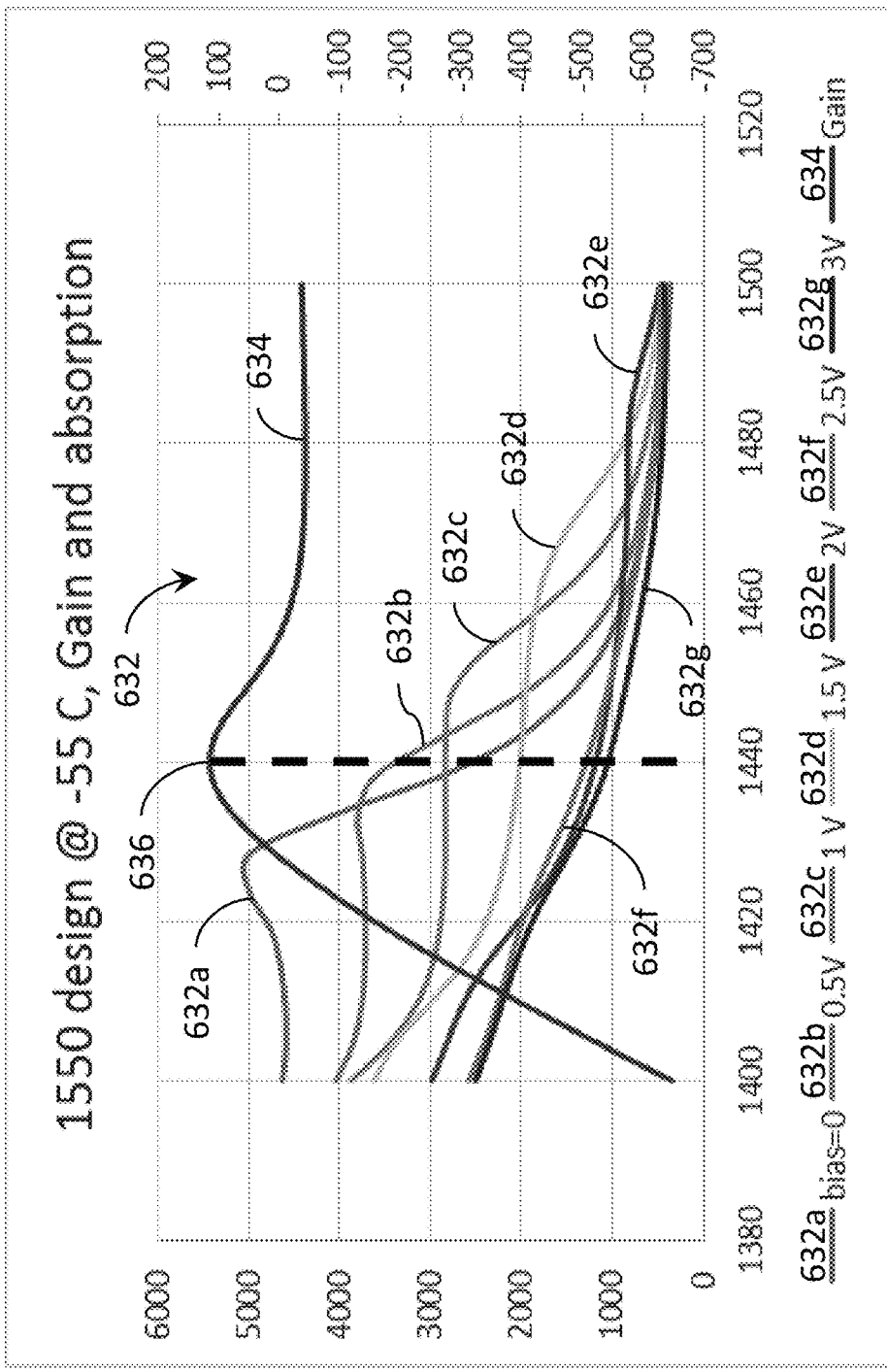
FIG. 6D is a graph depicting the absorption spectrum of the modulator as a function of applied bias along with the gain spectrum under the lasing condition at −55 C for a 1550 nm laser.

This structure matches the absorption spectrum and lasing wavelength over temperature similar to the 850 nm design though the absorptions are lower. Referring to FIG. 6A both the wavefunction overlap method and the standard Stark shift can be used. For example going from 0 volts 602$a$ to 1 volt 602$c$ the standard Stark shift is used. Going from 1 volt 602$c$ to 3 volts 602$g$ the wavefunction overlap method is used. The quantum well confinement factor for each quantum well along with the total quantum well confinement factor for the thick structure (Table 2 and FIG. 6E) are shown in the table of FIG. 6F. The total quantum well confinement factor is 0.182 (652). With the substantial absorption coefficients at the lasing wavelengths a 3 db extinction ratio requires the EAM be 23 microns and 6 db requires 43 microns. Both are substantially less than is typical of EAMs which usually operate in the low absorption tails of the absorption spectrum. For the thin structure the quantum well confinement factor is 0.196, as depicted in the table of FIG. 6H, which with the available absorptions gives a 3 db extinction ratio at 21 um and 6 db at 42 um. Again these are quite short, less than 50 um, allowing for easy driving. Using 19 wells instead of 10 wells gives a device with a 3 db extinction ratio at only 12 um length. This is due to the enhanced quantum well confinement factor of 0.31. The negatives of using this many wells is a reduction in the maximum amount of power which can be modulated due to charge in transit and less sensitivity to applied voltage due to the increased thickness. Tradeoffs can be made in the various parameters depending on the optimal target specifications for the final device. While all the devices shown and investigated used a peak absorption (highest modulated absorption) significantly greater than 1300/cm this is a useful lower bound for the peak absorption or the devices become excessively large and hard to drive. Another useful active region uses a well with a slight depression or shallow "V" shape or "U" shape at the bottom. This is useful to enhance the performance of the 1550 nm device in the Stark shift mode, which allows for lower applied voltages and thus lower power consumption.

Figure 7A:
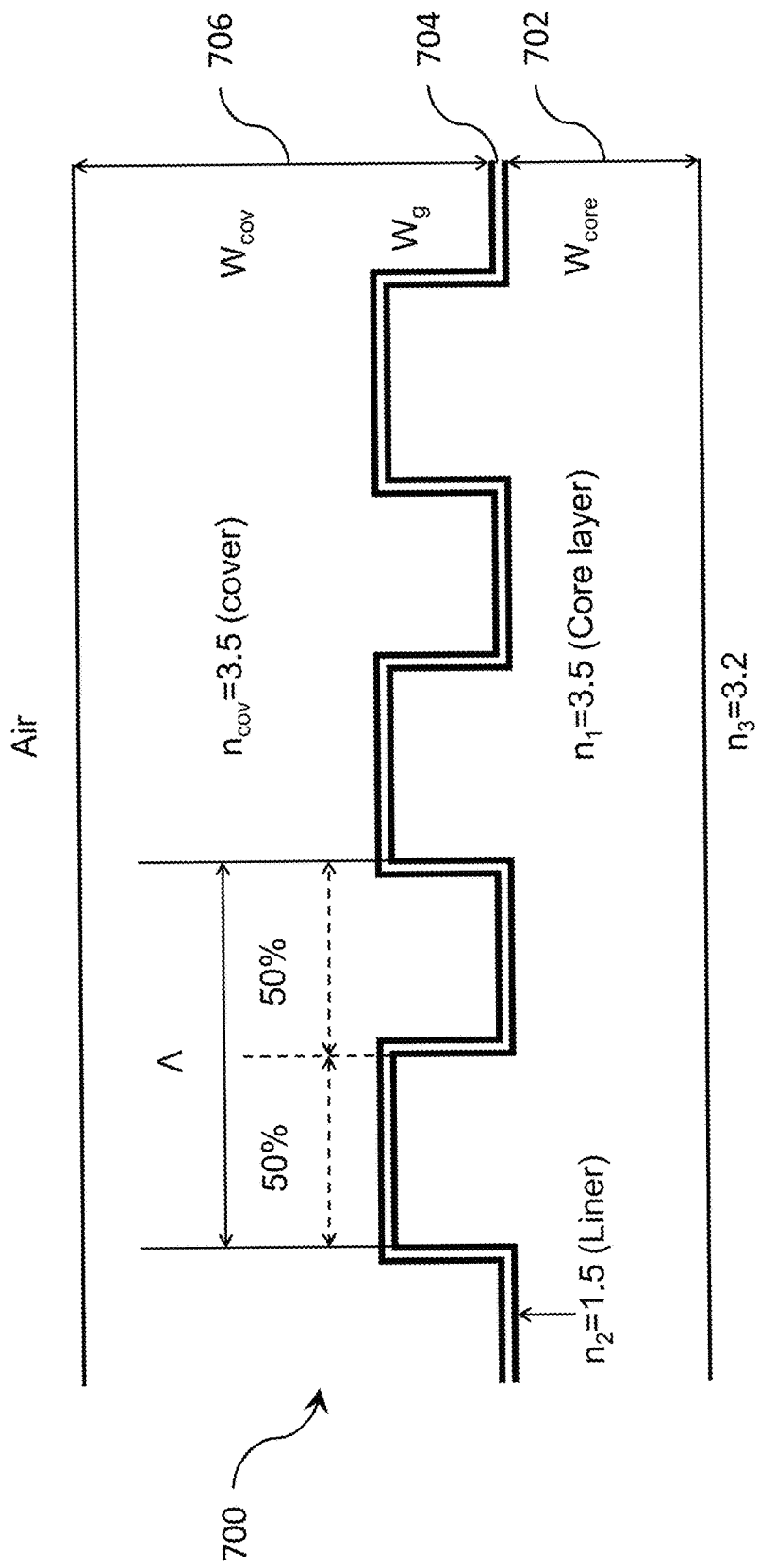
FIG. 7A is a diagram illustrating the general concept of an Enhanced Coupling Strength (ECS) grating consisting of three grating layers: a high index semiconductor grating, a low index liner grating, and a high index cover layer.

FIG. 7A is a diagram illustrating the enhanced coupling strength ("ECS") grating output coupler region 700 including three grating layers: a high index (such as semiconductor) layer 702, a low index liner 704, and a high index cover layer 706. The thin low index liner 704 is deposited over the grating profile in layer 702. The enhanced coupling strength gratings [Evans et al., "Enhanced Coupling Strength Gratings," US Patent Application Publication US 2015/0063753 A1, Mar. 5, 2015] used for >100 GHz lasers consist of three layers: 1) a high index (~3.5) (such as a semiconductor) layer 702 (in this example InP), 2) a thin (~25 nm) low index (~1.5) (such as SiO2) layer 704, and 3) a high index (~3.5) (such as amorphous silicon) layer 706.

Figure 7B:
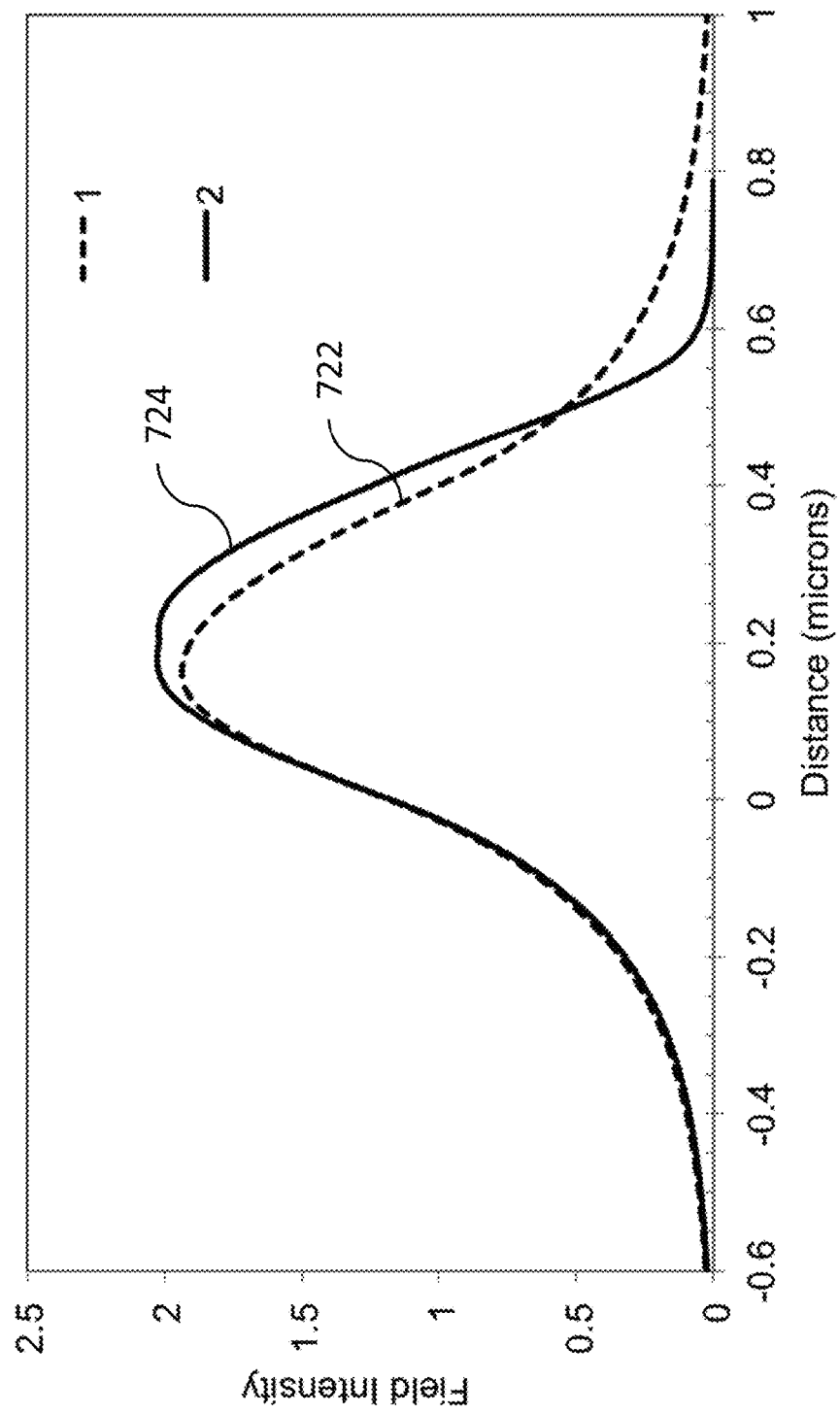
FIG. 7B is a graph depicting the intensity profiles corresponding to the laser region and the output coupler region.

FIG. 7B overlays the normalized intensity plot of the laser region 722 (Table 1) and normalized intensity plot of the grating output coupler region 724 (Table 4). The intensity overlap of the laser region and the grating region is 96%. Without an amorphous Si layer and above the grating, the mode in the grating region would be cutoff and will not propagate.

TABLE 4

Figure 6E:
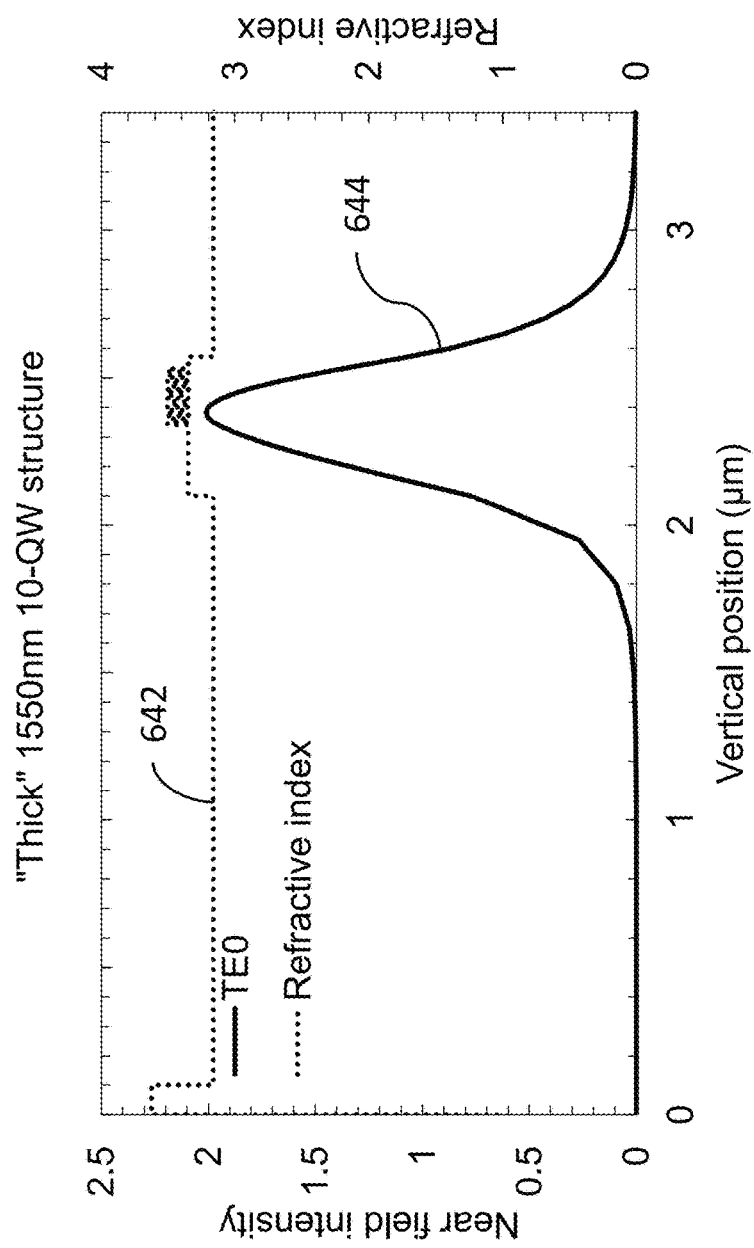
FIG. 6E is a graph depicting the optical mode for a thick 1550 nm structure.
Figure 6G:
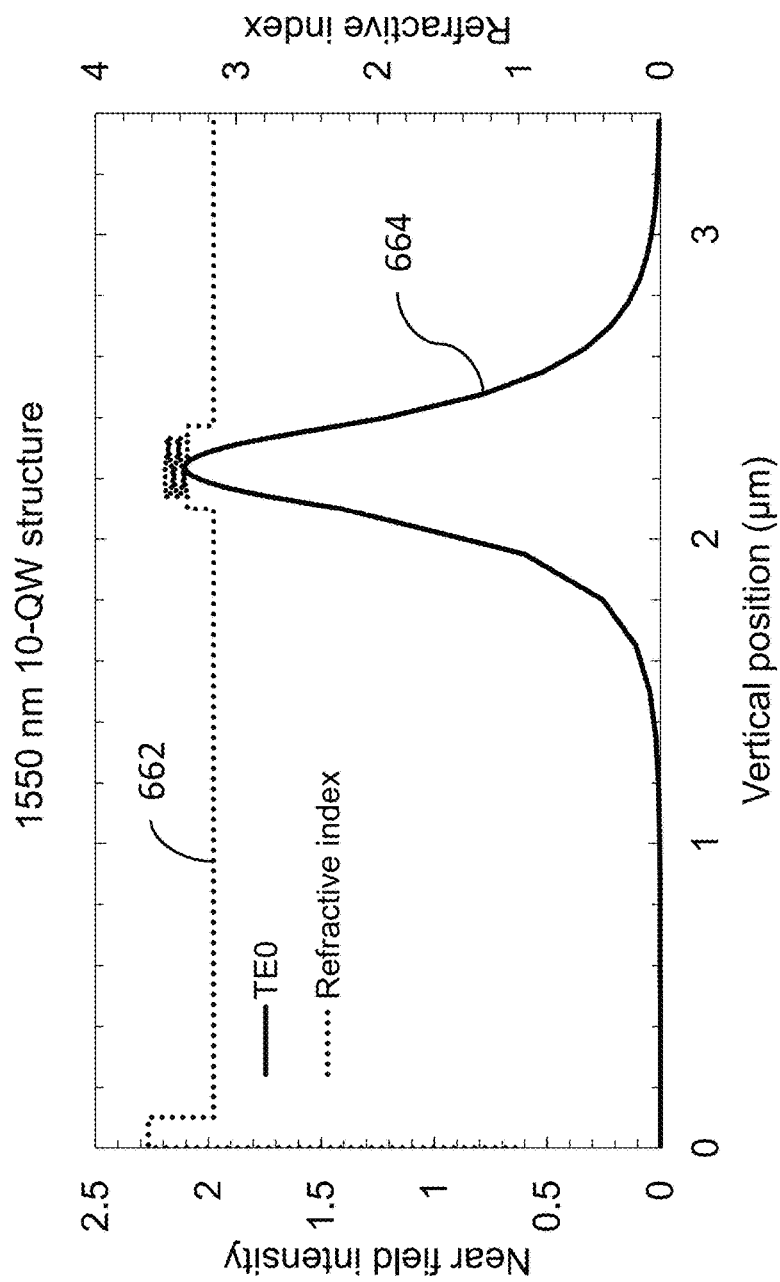
FIG. 6G is a graph depicting the optical mode for a thin 1550 nm structure.

Composition, layer thickness and doping of the grating output-coupler section for the thick 10 Quantum Well 1550 nm structure shown in FIG. 6E and Table 2.

| Layer | Composition | Thickness (um) | Material Index |
|---|---|---|---|
| Air | — | — | 1 |
| A_Si | Amorphous Silicon | 0.150 | 3.476 |
| Grating 3 | 52% SiO$_2$ + 48% Si | 0.005 (SiO$_2$ TL) | 2.628* |
| Grating 2 | 50% barrier(SCH) + 2% SiO$_2$ + 48% Si | 0.190** | 3.385* |
| Grating 1 | 50% barrier(SCH) + 50% SiO$_2$ | 0.005 (SiO$_2$ TL) | 2.585* |
| SCH | In$_{0.74}$Ga$_{0.26}$As$_{0.5}$P$_{0.5}$ | 0.041*** | 3.35110 |
| 9x barriers | In$_{0.74}$Ga$_{0.26}$As$_{0.5}$P$_{0.5}$ | 0.01 | 3.35110 |
| 10x QWs | In$_{0.74}$Ga$_{0.26}$As$_{0.79}$P$_{0.21}$ | 0.01 | 3.50636 |
| SCH | In$_{0.74}$Ga$_{0.26}$As$_{0.5}$P$_{0.5}$ | 0.041*** | 3.35110 |
| N substrate | InP | — | 3.16492 |

Figure 7C:
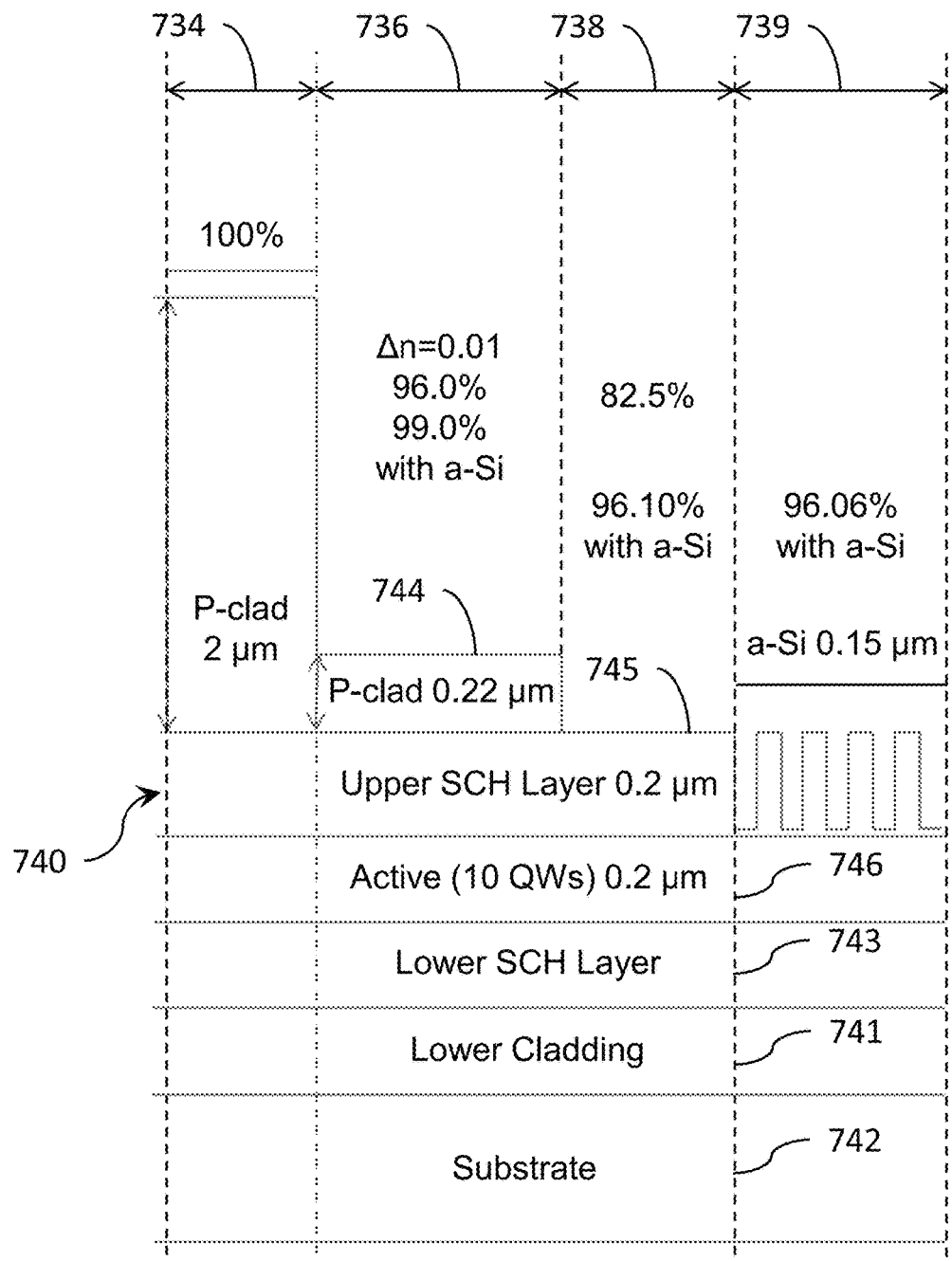
FIG. 7C is a diagram illustrating the details between the transitions between a full epitaxial region, one transition region, a second transition region and the grating region.

FIG. 7C is a diagram illustrating the details between the transitions between a full epitaxial region 734, a first transition region 736, a second transition region 738 and a grating region 739. The full epitaxial region 734 represents the laser gain section 109 and the EAM 104, and the photodiodes 112 and 114 of FIG. 1A. The first transition region 736 corresponds to the etch depth that determines the lateral confinement ("delta-n" is −0.01 to −0.001 for InP devices) of the optical mode in the ridge region 132 of the laser gain section 109, EAM section 104, and the photodiode sections 112 and 114. The second transition region 738 is a flat transition region between the first transition region 736 and the grating region 739. The grating region 739 represents the output coupler 106 and the mirrors 108, and 110. The second transition region 738 diagrammatically illustrates the etch depth that determines the top of the grating output coupler 106 or the top of the mirrors 108 and 110. Depending on the epitaxial design, the height of the second transition region 738 may be above, below or equal to that of the first transition region 736. In addition, the top of the mirrors 108 and 110 may be at a different height than that of the output coupler grating 106.

Adding the silicon dioxide liner and the amorphous silicon used in the grating output coupler region 739 reduces the mode mismatch between a) the full epitaxial region 734 and the first transition region 736 from 96% to 99%; b) the full epitaxial region 734 and the second transition region 732 from 82.5% to 96.1%; and d) between the full epitaxial region 736 and the grating region 700 from 0 to 96.06%.

The laser 102, with integrated modulator 104 and the detector sections 112 and 114, have the same index profile and thus essentially the same mode profiles as the laser section. As a result, the calculated modal overlaps between the modal profile for each of these sections 724 and the modal profile for the grating output coupler 722 of FIG. 7B will be the same and have a value of 96.06% for the 1550 nm structures shown in Tables 3 and 4.

Figure 7D:
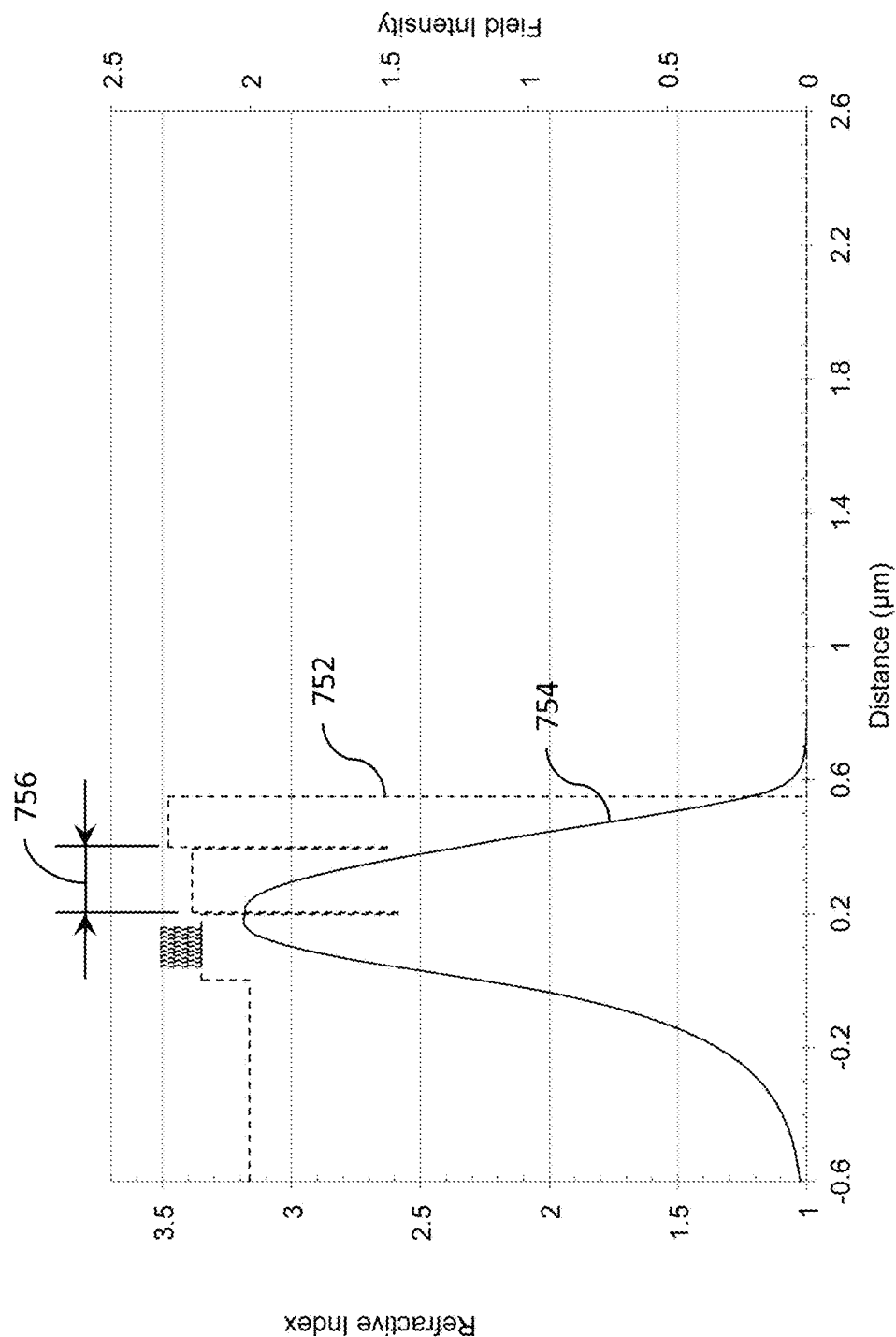
FIG. 7D is a graph depicting the near field intensity profile of the grating region of a 10 quantum well laser structure consisting of the layer compositions and thicknesses listed in Table 4.

The index profile FIG. 7D shows the complete index profile of the grating region and incorporates the ECS grating detail shown in FIG. 7A. Effective indices used for the grating layers 756 are calculated by averaging the permittivities of each layer as described in (Evans et al., "Enhanced Coupling Strength Gratings," US Patent Application Publication US 2015/0063753 A1, Mar. 5, 2015) The resulting index profile of FIG. 7D is used to calculate the mode profile 724 of the grating region shown in FIG. 7B.

The active region of the laser and the modulator use the same design, and as such must be made to work with both the modulator and the laser. In both cases each device benefits by a strong overlap of the optical field with the quantum wells. This is achieved using a large index of refraction difference between the cladding and the active region. Whether the mode is TE or TM depends on which polarization couples to the gain of the laser section best. Likewise, since gain and absorption are really different manifestations of the same fundamental process the choice of TE or TM polarization made by the laser will be the optimal choice also for the absorber.

A lower cladding region is formed on the substrate 742. The lower cladding layer 741 is made to be conductive n-type (p-type) and has a lower index of refraction than the active region 746. On the lower cladding region is formed an n-type (p-type) SCH region 743 used to confine the carriers to the active region 746 and to inject electrons (holes) into the active region 746. The lower SCH is designed to provide good electrical confinement of carriers, while being low in resistance and not causing excess absorption. The doping is high enough to prevent significant depletion of carriers where it acts as the lower contact of the modulation region.

An active region 746 that includes a number of specialized quantum wells is formed on the lower SCH layer. The function of the active region 746 in the laser region 734 is to provide gain so the laser cavity supports a lasing mode, i.e. the round trip gain is 1. The function of the active region 746 in the modulator section is to absorb the transmitted laser light, so that the absorption is a function of the reverse bias applied. There is less absorption with more reverse bias when using the wavefunction overlap method of modulation and more absorption with more reverse bias using the standard band edge Stark shift A p-type (n-type) upper SCH layer 745 is formed on the active region. The upper SCH is designed to provide good electrical confinement of carriers, while being low in resistance and not causing excess absorption. The doping is high enough to prevent significant depletion of carriers where it acts as the lower contact of the modulation region.

An upper p-type (n-type) cladding layer 744 is formed on the upper SCH layer. The upper SCH layer has an index of refraction significantly lower than the active region to provide optical confinement to the active region.

A contact layer is formed on the upper cladding layer to make electrical contact for both the modulator section and the laser section.

Another important consideration in designing a DBR laser and a grating output coupler integrated with a laser or other photonic components, is the efficiency and length of the grating outcoupler and of the DBR regions.

Figure 8:
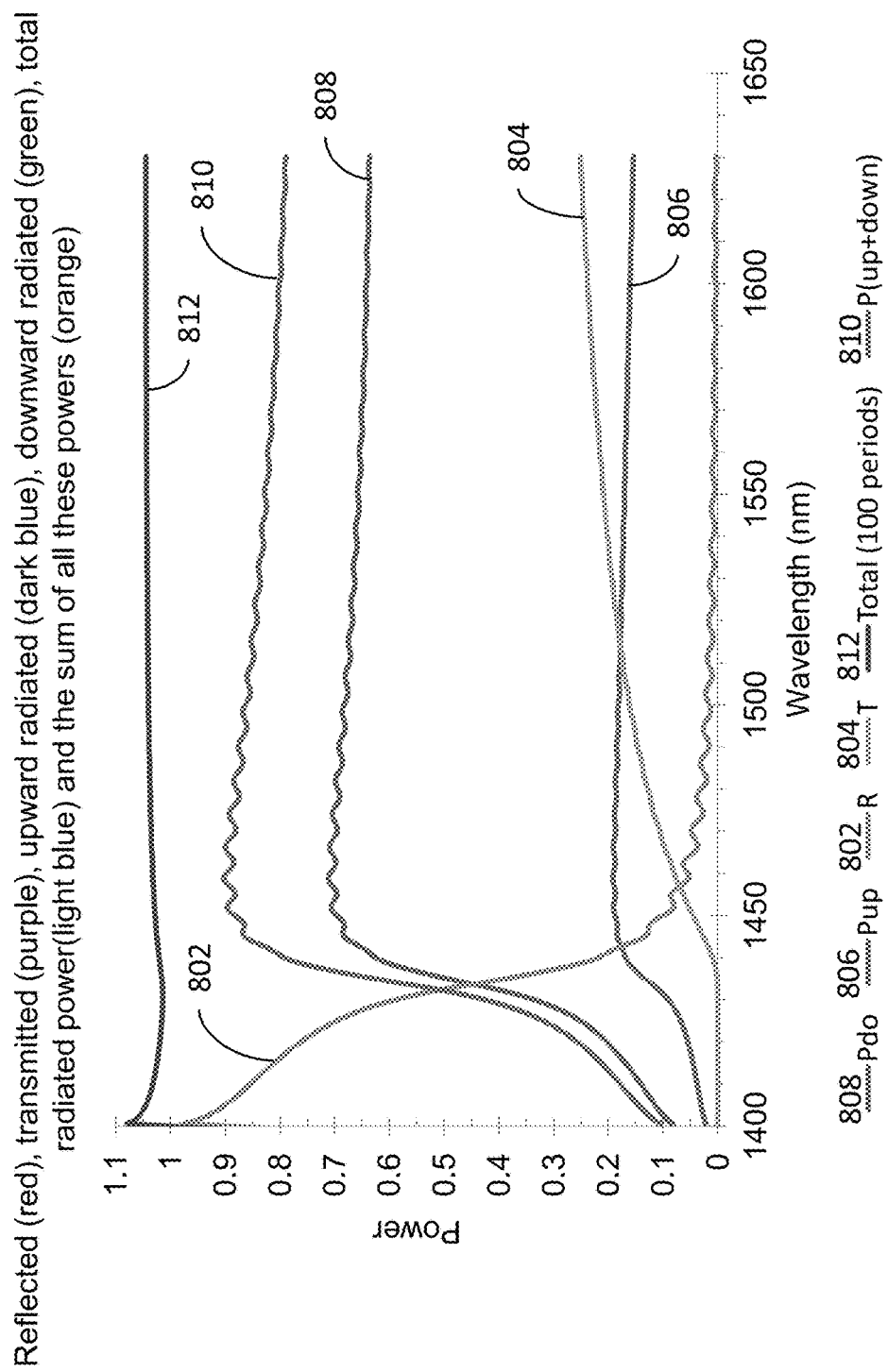
FIG. 8 is a graph depicting the reflected, transmitted and upward radiated, downward radiated, total radiated power and the sum of all these powers.

FIG. 8 is a graph generated using grating analysis software [1. G. Hadjicostas, J. Butler, G. A. Evans, N. W. Carlson, and R. Amantea, "A Numerical Investigation of Wave Interactions in Dielectric Waveguides with Periodic Surface Corrugations," IEEE Journal of Quantum Electronics, Vol. 26, No. 5, pp. 893-902, May 1990.] [2. J. K. Butler, N. H. Sun, G. A. Evans, L. Pang, and P. Congdon, "Grating Assisted Coupling of Light Between Semiconductor and Glass Waveguides," Journal of Light-wave Technology, Vol. 16, No. 6, pp. 1038-1048, June, 1998.] capable of independently calculating the reflected, transmitted, and radiated power (both upwards and downwards) of three layer ECS gratings as shown in Table 4 and FIG. 7A. The sum of the reflected, outcoupled and transmitted light, add up to the incident power—this calculation is used to check the accuracy of the software. FIG. 8 is a graph depicting the fraction of reflected power 802, transmitted power 804, upward radiated power 806, downward radiated power 808, total radiated power 810, and the sum of all these powers 812 for a grating output coupler for the 10 QW InGaAsP/InP grating structure (FIG. 7d and Table 4) operating at wavelengths near 1550 nm. Use of this software allows the design of grating structures for efficient out-coupling in distances as short as tens of microns. For the InGaAsP structure designs corresponding to Tables 2 and 4, almost 75% of the power is out-coupled out in 100 grating periods, or about 50 microns. The maximum out-coupling occurs approximately 40 nm away from the exact Bragg condition. However, the reflectivity of the output coupler grating is negligible at about 80 nm away from the exact Bragg condition, which is desirable to reduce reflections into the laser or amplifier sections. By increasing the number of periods in the grating out-coupler, the amount of out-coupled power can be increased to well over 90%. The grating results shown in FIG. 8 is typical of the calculations that are performed on laser/EAM/detector structures at wavelengths ranging from 300 nm to 2000 nm and allow the design of efficient low cost >100 Gbs modulated surface-emitting lasers.

The ratio of upward coupled radiation to downward coupled radiation can be calculated by upward radiated power 806 and downward radiated power 808 depicted in FIG. 8. This ratio is a function of the indices and thicknesses of the layers that form the output coupler region 700. However it is possible to direct almost all of the light either upwards (top cross section in FIG. 1D) or downwards (bottom cross section in FIG. 1D), depending on how the device will be used.

To obtain the maximum usable power requires an anti-reflection coating on the output surface and a high-reflection coating on the opposite surface. One or both of these coatings can be a single or a multilayer dielectric stack grown into the epitaxial structure. This configuration, first used in vertical-cavity lasers, has been used to direct most of the outcoupled light towards the emitting surface of a grating-outcoupled surface emitting device (Evans, 1991). The additional series resistance due to the added layers has been either minimized by grading the composition of the interfaces between the layers or eliminated by etching through the layers outside the optical region so that the current path bypasses the multiple layers (Corzine and Coldren, 1991). A simple, alternative approach is to use a single layer of dielectric with an appropriate index and thickness (such as Si3N4) as the anti-reflection coating and a similar dielectric layer with a high reflectivity coating (such as Au) as the high reflection layer for a grating-outcoupled surface emitting laser. The high reflectivity coating of a dielectric layer with a reflective coating works equally well over a smooth surface or over a grating out-coupler (Evans, 1991). Such anti-reflection and high-reflection coatings have demonstrated reflections of <1% and >90% respectively (Evans et al., 1991).

If the grating-outcoupled devices are mounted epitaxy-side down, a substrate must be transparent (Evans et al., 1991) or must have etched windows (Macomber et al., 1987) in the emitting region. If the grating-outcoupled devices are mounted epitaxy-side up, the substrate may be etched away in the region of the outcoupler and a high-reflect coating applied to the region under the grating outcoupler. For emission wavelengths above about 0.94 μm, GaAs and InP are transparent. For wavelengths as short as 0.8 μm, AlGaAs substrates have been used (Evans et al., 1989). Another packaging approach is the epitaxial lift-off technique (Yablonovitch et al., 1987), which may be especially useful for grating outcouplers operating at wavelengths where transparent substrates are not readily available.

For the proposed device, one DBR grating has a reflectivity approaching 100% and the other DBR grating should have a lower reflectivity (in the 1 to 50% range). Equally important is that the spectral width of the reflectivities of both DBR regions be large—on the order of 130 nm to accommodate operation over a temperature range of about 100 C.

The power reflectivity of a DBR grating is given by Eq. 1 [reference: A Yariv. Photonics: Optical electronics in modern communications. 2007, New York: Oxford University Press.]

$$|R|^2 = \frac{(\kappa L)^2}{(\Delta \beta L)^2 + (\gamma L)^2 \coth^2(\gamma L)} \quad \text{Eq. 1}$$

where we have assumed that losses in the passive grating region are negligible, since $$R = \frac{j\kappa}{(\alpha + j\Delta\beta) - \gamma \coth(\gamma L)} \quad \text{Eq. 2}$$

where $$\kappa_{pq} = C_{kn}^{(m)} = \frac{\omega \varepsilon_0}{4} b_m (n_1^2 - n_2^2) \cdot \int_{-a}^{0} E_p^*(x) E_q(x) dx \text{ and} \quad \text{Eq. 3}$$

$$\gamma = \sqrt{\kappa^2 + (\alpha - j\Delta\beta)^2} \quad \text{Eq. 4}$$

Figure 9A:
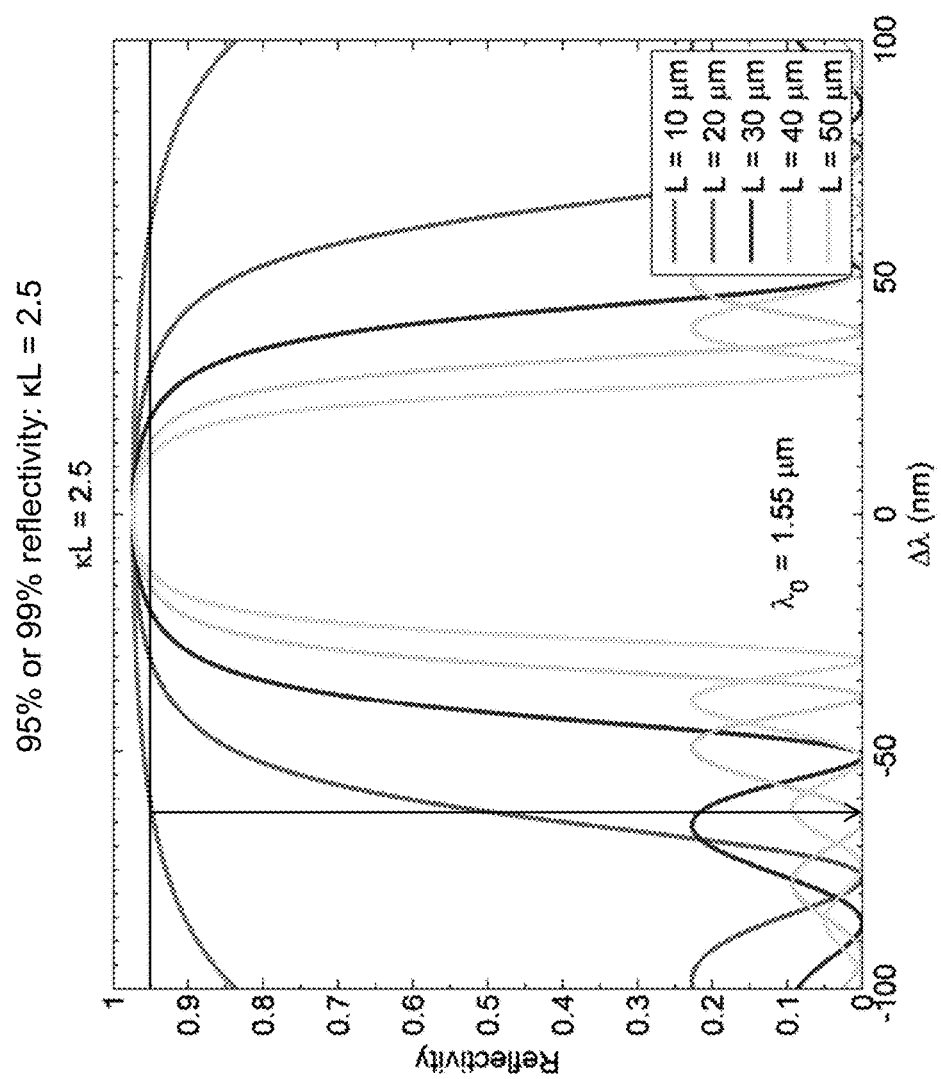
FIG. 9A is a graph depicting reflectivity as a function of a delta (change in) wavelength for kappa*L=2.5 and reflectivity of >95% is achieved at L=10 μm.
Figure 9B:
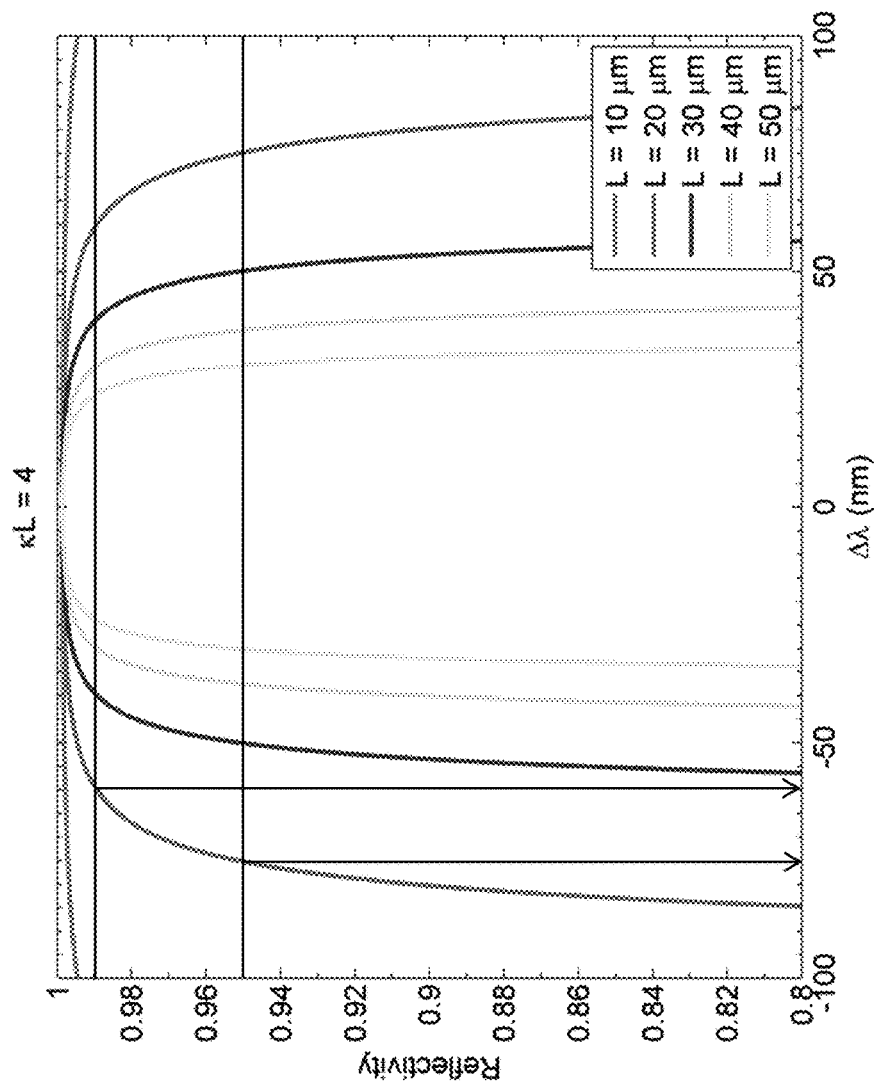
FIG. 9B is a graph depicting reflectivity as a function of a delta (change in) wavelength for kappa*L=4 and reflectivity of >95% is achieved at L=20 μm.
Figure 9C:
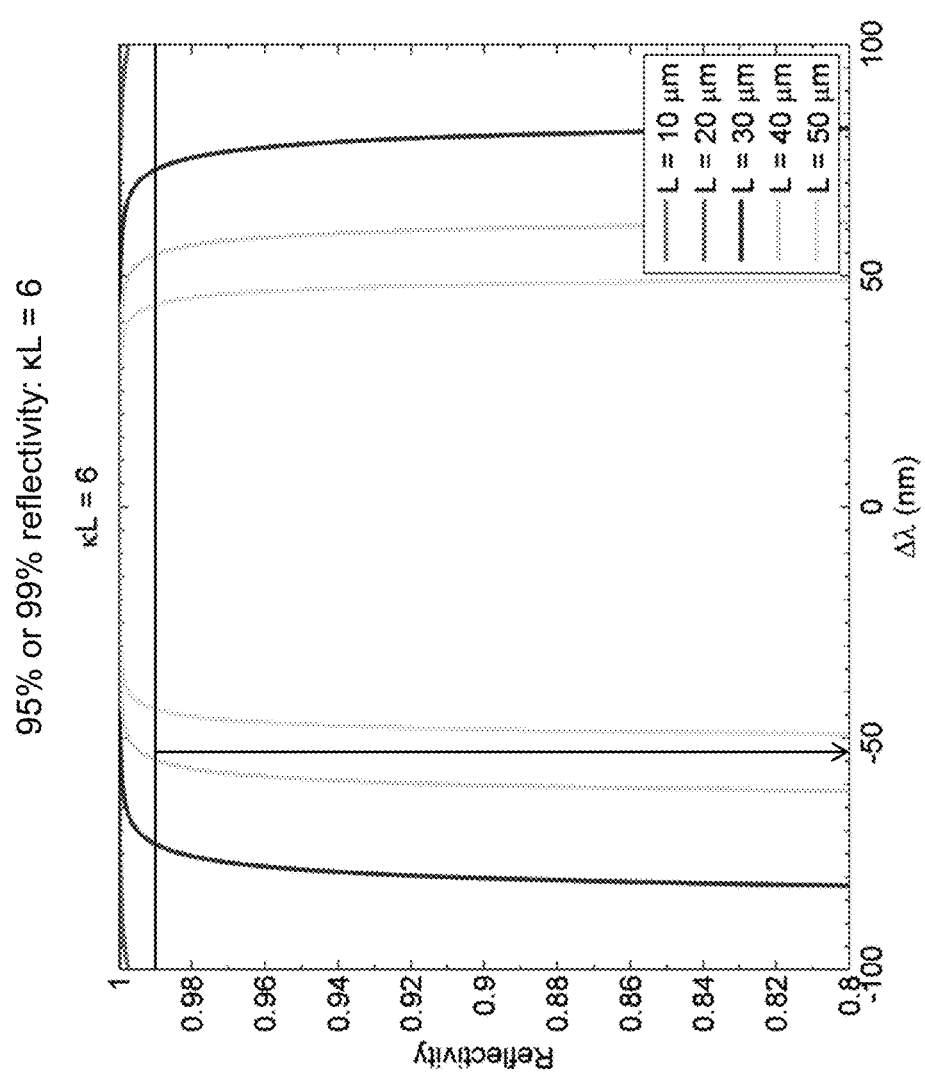
FIG. 9C is a graph depicting reflectivity as a function of a delta (change in) wavelength for kappa*L=6 and reflectivity of >99% is achieved at L=40 μm.
Figure 9D:
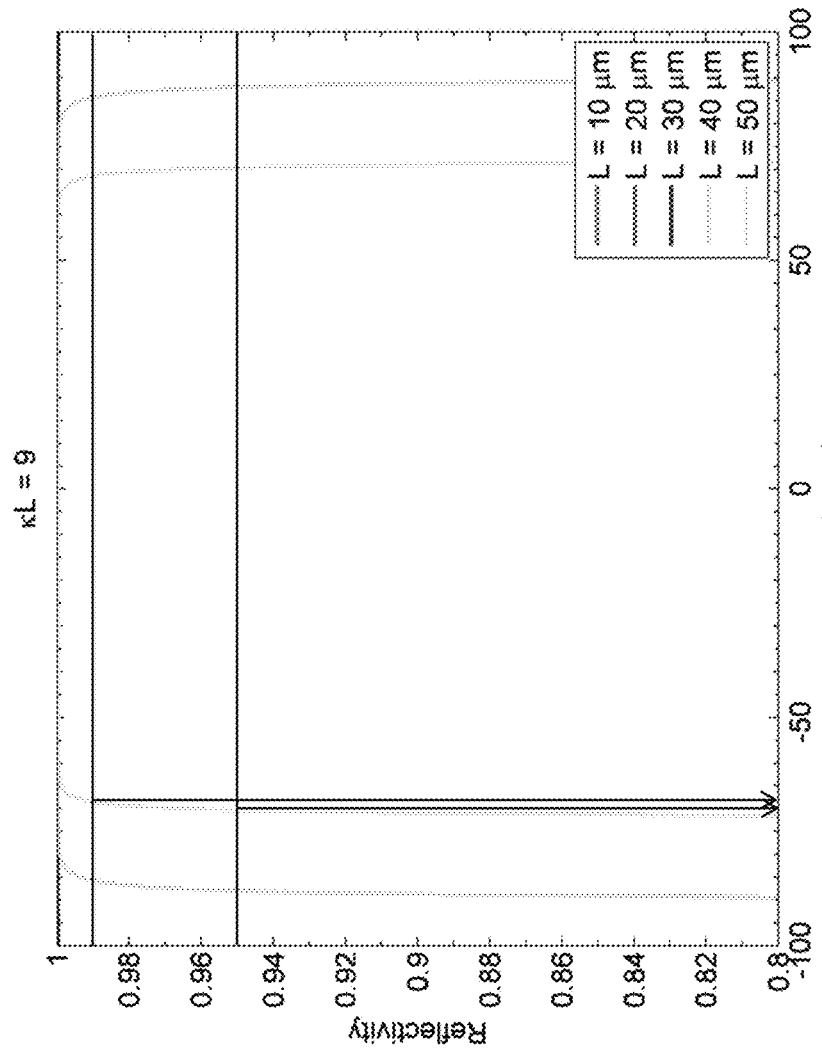
FIG. 9D is a graph depicting reflectivity as a function of a delta (change in) wavelength for kappa*L=9 and reflectivity of >95% is achieved at L=50 μm.

FIG. 9A is a plot generated based on Equation 1 for kappa*L=2.5, FIG. 9B is a plot generated based on Equation 1 for kappa*L=4 and FIG. 9C is a plot generated based on Equation 1 for kappa*L=6. FIG. 9A shows that reflectivities of greater than 95% can be achieved over a 126 nm spectral region for grating lengths on the order of 10 to 20 microns, which is suitable for the high reflectivity end of a DBR laser. FIG. 9B shows that reflectivities of greater than 99% can be achieved over a range of 120 nm and greater than 95% can be achieved over a range of 150 nm, in both cases for a grating length of 20 microns. FIG. 9C shows that a reflectivity of greater than 99% can be achieved over a spectral range of 110 nm for a grating length of 40 microns. FIG. 9D shows that a reflectivity of greater than 99% can be achieved over a spectral width of 136 nm for a grating length of 50 microns.

Figure 10A:
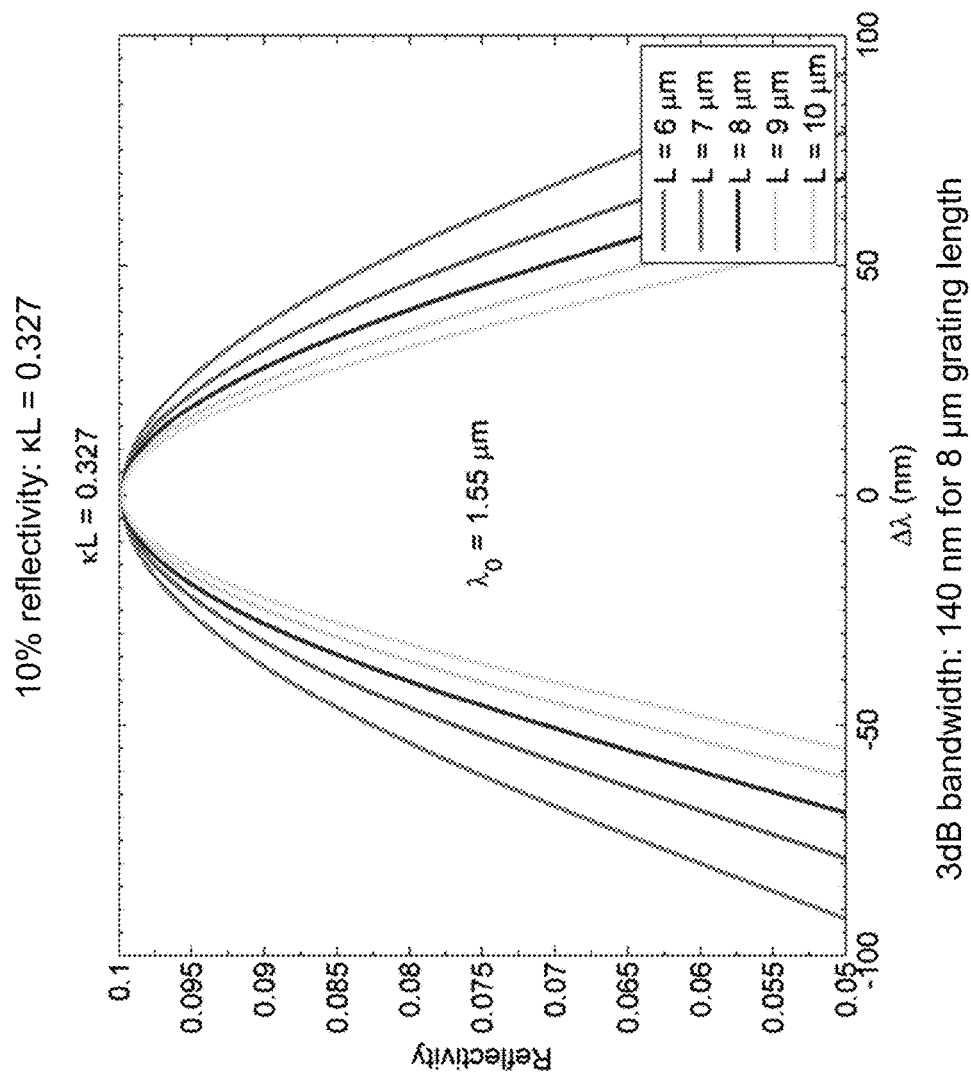
FIG. 10A is a graph depicting reflectivity as a function of a delta (change in) wavelength for kappa*L=0.327, over a spectral range of 140 nm for 8 μm grating length.
Figure 10B:
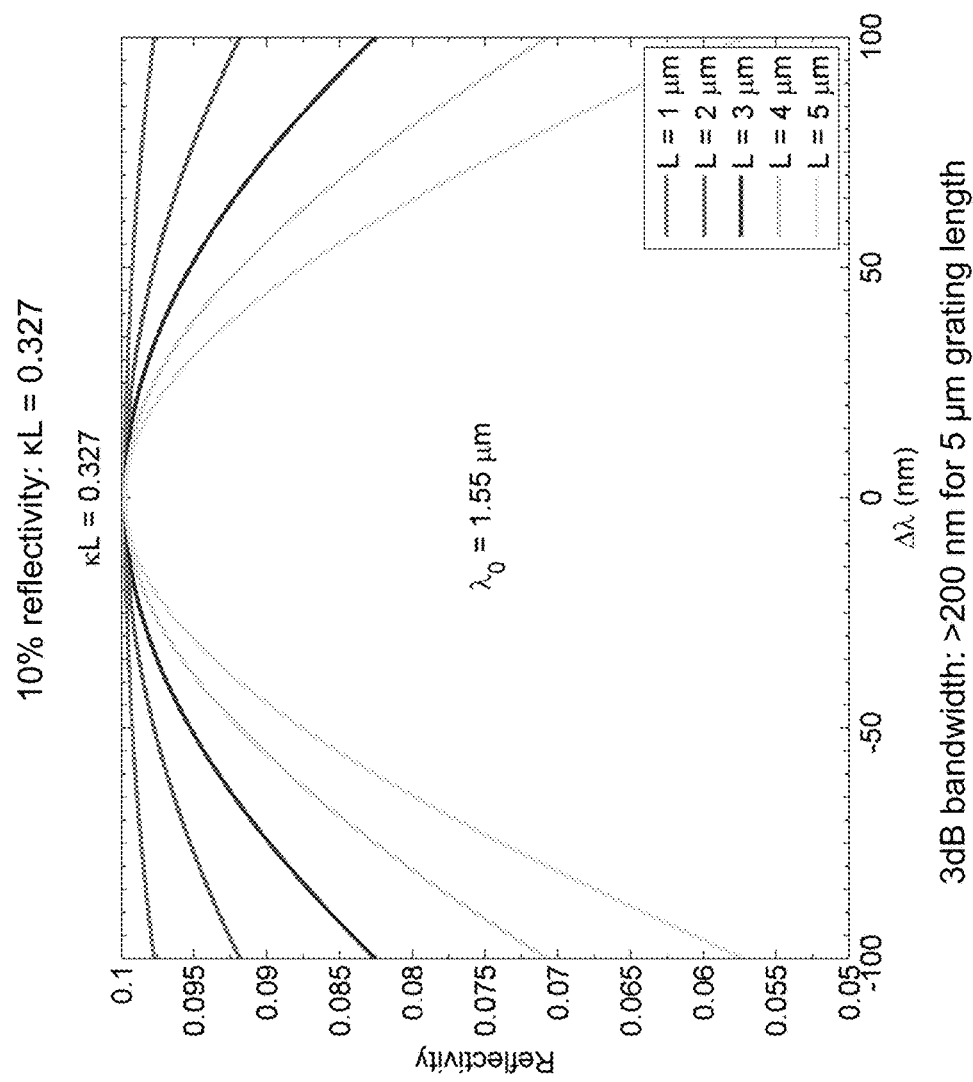
FIG. 10B is a graph depicting reflectivity as a function of a delta (change in) wavelength for kappa*L=0.327, over a spectral range of >200 nm for 5 μm grating length.
Figure 10C:
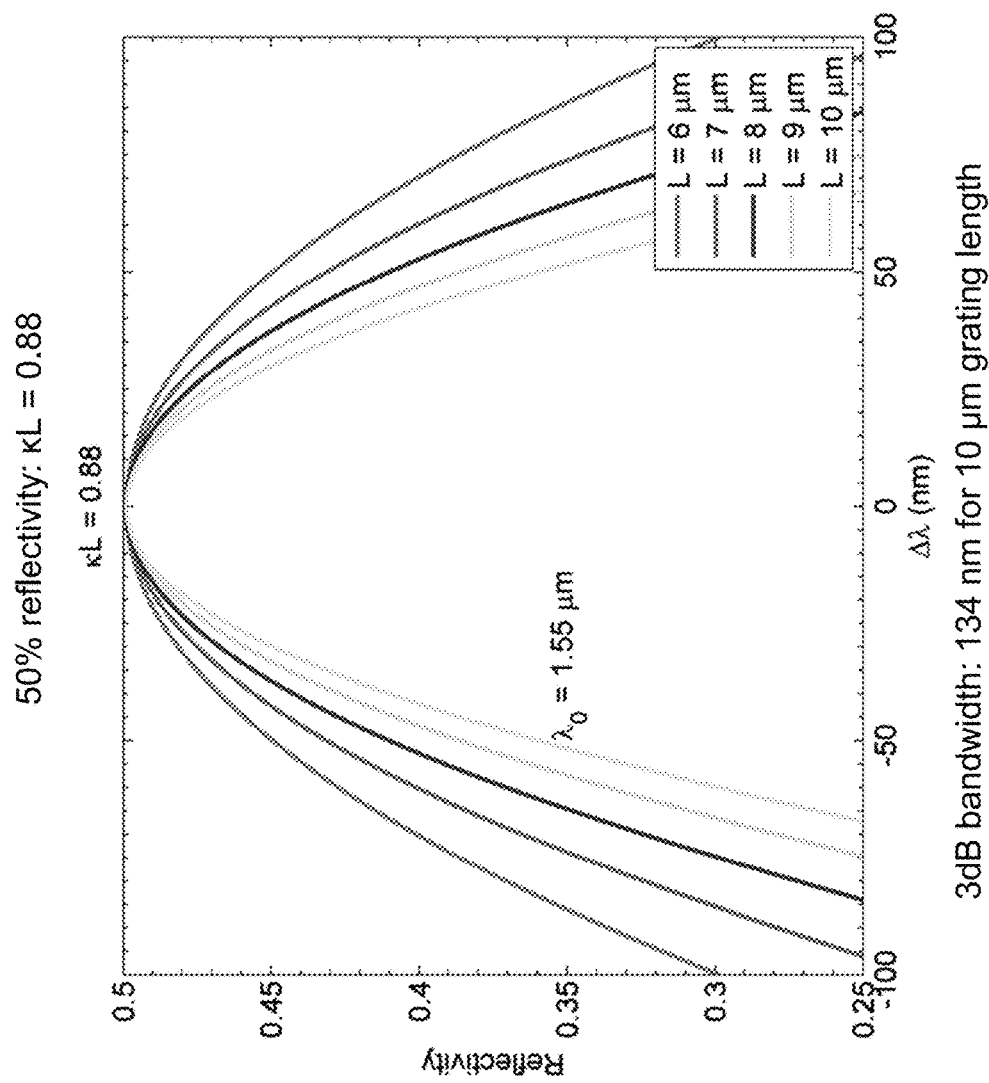
FIG. 10C is a graph depicting reflectivity as a function of a delta (change in) wavelength for kappa*L=0.88, over a spectral range of 134 nm for 10 μm grating length.
Figure 10D:
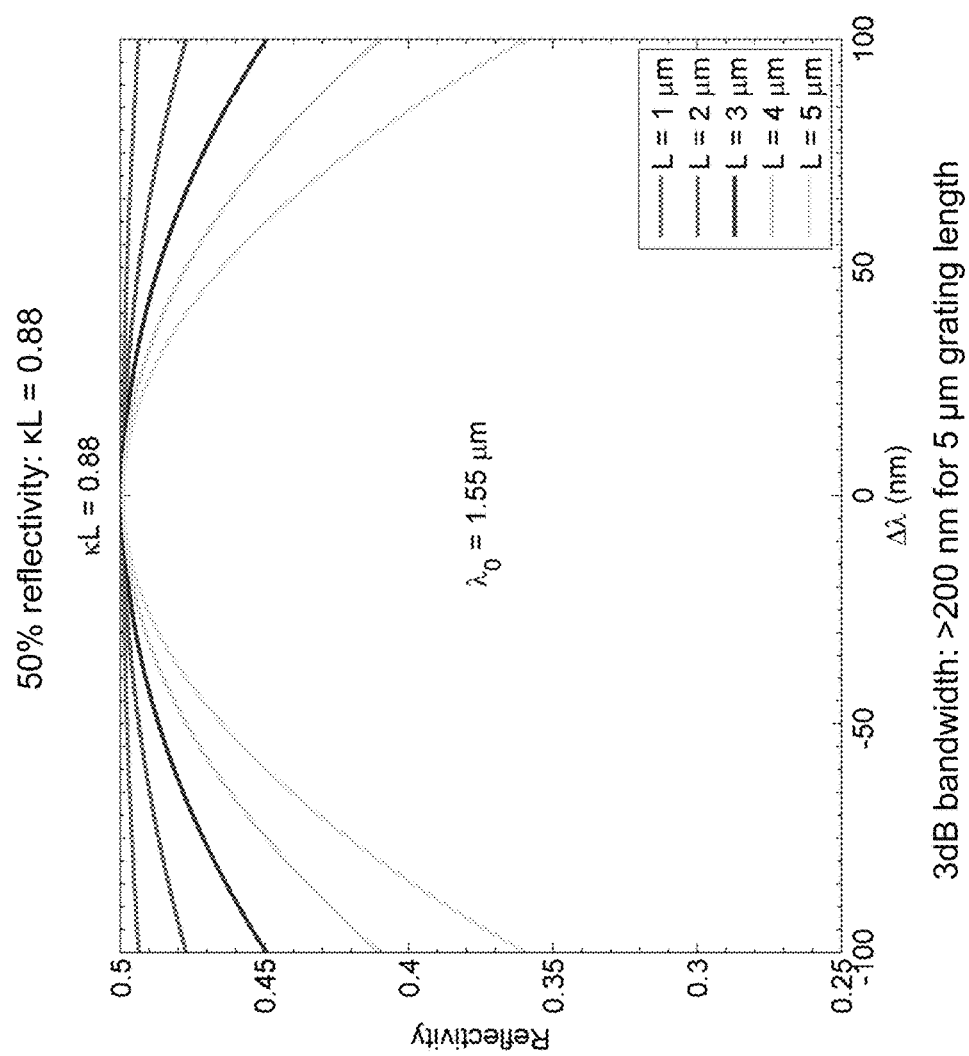
FIG. 10D is a graph depicting reflectivity as a function of a delta (change in) wavelength for kappa*L=0.88, over a spectral range of >200 nm for 5 μm grating length.

FIG. 10A shows that a reflectivity between 5.0% and 10% can be achieved over a 140 nm spectral range with a grating length of 8 microns. FIG. 10B shows that a reflectivity between 8% and 10% can be achieved over a 200 nm spectral range with a grating length of 5 microns. FIG. 10C shows that a reflectivity between 25% and 50% can be achieved over a 130 nm spectral range with a grating length of 10 microns. FIG. 10D shows that a reflectivity between 45% and 50% can be achieved over a 200 nm spectral range with a grating length of 5 microns.

While the specifics of the quantum well design and bias voltage cause the general spectral overlap of the lasing wavelength and the region of strong modulation of absorption (>1300/cm) active fine tuning of this alignment is useful to dynamically optimize the output. This can be done primarily through adjustment of the temperature differential between the laser 102 and the modulator 104. The resistive heaters are one method to do this, however, laser power absorbed in the modulator, IV heating in the laser not compensated by light emission, IV heating in the modulator, all provide extra ability to adjust the temperature difference. Any combination of these may be used to fine tune the temperature difference. In addition, thermal impedance differences in the mounting or structure of the devices provides another method to tune the temperature difference. These are all to fine tune the alignment of the lasing wavelength and the region of the absorption spectra to optimize the eye diagram and the output power. They are in addition to the main control discussed earlier for this optimization.

Mounting and packaging considerations are extremely important at the speeds this device is capable of. Referring back to FIG. 1C the device 100 is ideal for flip-chip mounting so that the chip is flipped over and bonded using for example solder bumps directly to the control circuit 120. The control circuit 120 then provides both the electrical connections as well as the primary thermal dissipation. Extra solder bumps are useful for added thermal dissipation or to control the thermal profile through the device. Flip-chip mounting also limits parasitic capacitance and inductance by allowing small pads that are closely spaced, and small bump heights. This is very important for high speeds. Being able to take the light out through the substrate 130 aids in fiber coupling, especially in light of the ability to use integrated lensing and an anti-reflection coating on the substrate 130 side, or bottom, of the device. Lenses can either be integrated into the substrate, attached, or external. The bump pads can be quite small with pitches of 100 um or less. This ability to be flip-chipped easily and have the light coupled vertically into a fiber or fiber ribbons for linear arrays, or bundles for two dimensional arrays makes the device 100 ideal for chip-to-chip communication either closely spaced or across a data center.

What is claimed is:

1. A laser with integrated modulator, comprising:
   a laser capable of emitting light, the laser further comprises a laser gain section, a first mirror and a second mirror, each of the mirrors coupled to the laser gain section;
   wherein the laser gain section contains quantum wells;
   a modulator coupled to the laser to receive the light and capable of modulating the light to vary the output from the modulator;
   wherein the first mirror and the second mirror have a wavelength bandwidth sufficient for a lasing wavelength range of the laser;
   wherein the first mirror and the second mirror are high spectral bandwidth mirrors;
   wherein the modulator contains quantum wells and the modulator has a quantum well confinement factor that is greater than 0.1,
   an output coupler coupled to the modulator, wherein the output coupler has a back reflection that is less than half of a back reflection of the second mirror; and
   wherein the laser has a lasing wavelength that tracks the absorption spectrum of the modulator over temperature.

2. The device of claim 1, further comprising a first heating element coupled to the laser and a second heating element coupled to the modulator.

3. The device of claim 2, wherein the first and second heater elements are adjusted to optimize a current passing through the modulator.

4. The device of claim 2, wherein the first and second heater elements are adjusted to optimize a current passing through a photodiode coupled to the modulator.

5. The device of claim 1, further comprising a photodiode coupled to the output coupler to monitor the modulation and output power of the modulator based on a current passing through the photodiode.

6. The device of claim 5, wherein the current passing through the photodiode is used to adjust a bias of the laser.

7. The device of claim 5, wherein the current passing through the photodiode is used to adjust a modulation amplitude of the modulator.

8. The device of claim 1, further comprising a photodiode coupled to the laser to sense and control the power of the laser based on a current passing through the photodiode.

9. The device of claim 8, wherein the current passing through the photodiode is used to adjust a bias of the laser.

10. The device of claim 8, wherein the current passing through the photodiode is used to adjust a bias and a modulation amplitude of the modulator.

11. The device of claim 1, wherein the laser is a Distributed Bragg Reflectivity laser using high spectral bandwidth mirrors.

12. The device of claim 1, wherein the mirrors are enhanced coupling strength gratings.

13. The device of claim 1, wherein the output coupler is a second order enhanced coupling strength grating.

14. The device of claim 1, wherein the quantum wells in the modulator have a peak absorption coefficient greater than 1300 per centimeter.

15. The device of claim 1, wherein the modulator is less than 50 microns in length.

16. The device of claim 1, wherein the first mirror has a high reflectivity of more than 75% and a length of less than 100 microns.

17. The device of claim 1, further comprising a control circuit, comprising:
a modulator driver to drive the modulator and a system controller that controls the modulator driver.

18. The device of claim 17, wherein the system controller is used to optimize a bias of the laser based on an AC current passing through the modulator.

19. The device of claim 17, wherein the system controller is used to optimize a bias of the laser based on a DC current passing through the modulator.

20. The device of claim 17, wherein the system controller is used to optimize a DC voltage bias of the modulator based on a DC current passing through the modulator.

21. The device of claim 1, further comprising a system controller to sense the AC and DC current in the modulator and a photodiode.

22. The device of claim 1, wherein the device is flip-chip mounted.

23. The device of claim 17, wherein the system controller is used to optimize a DC voltage bias of the modulator based on an AC current passing through the modulator.

24. The device of claim 1, wherein the quantum wells of the laser gain section are tilted.

25. The device of claim 1, wherein the quantum wells of the laser gain section and the quantum wells of the modulator are the same epitaxial growth.

26. The device of claim 1, wherein the quantum wells of the laser gain section and the quantum wells of the modulator are tilted and are the same epitaxial growth.

27. A method of modulating a device, comprising:
emitting light from a laser;
wherein the laser comprises at least one high spectral bandwidth mirror;
passing the light received from the laser through a modulator;
modulating the modulator by applying a voltage signal so as to vary the light output of the light passing through the modulator,
wherein the modulator is less than 50 microns in length;
passing the light through an output coupler that then outputs the light,
wherein the light has a lasing wavelength that is within the spectral region of a substantial absorption response to the voltage signal over temperature; and
operating at a temperature range comprising a first temperature and a second temperature, wherein the second temperature is greater than the first temperature by at least 15 degrees Celsius.

28. The method of claim 27, wherein the modulator is a wavefunction overlap modulator so that absorption at the lasing wavelength is decreased with increasing reverse bias.

29. The method of claim 27, wherein the modulator uses band edge shift to provide modulation so that absorption at the lasing wavelength is increased with increasing reverse bias.

30. The method of claim 27, further comprising passing a current through the modulator in a feedback loop to adjust the drive conditions.

31. The method of claim 27, further comprising sensing a current through the photodiode in a feedback loop to adjust the drive conditions.

32. The method of claim 27, wherein the temperature range is 25 to 70 C.

33. The method of claim 27, wherein the temperature range is 25 to 95 C.

34. The method of claim 27, wherein the temperature range is −55 to 125 C.

35. The method of claim 27, wherein the quantum well confinement factor for the modulator is greater than 0.1.

36. The method of claim 27, wherein the quantum well confinement factor for the laser is greater than 0.1.

37. The method of claim 27, wherein the modulator has quantum wells that have a peak absorption coefficient for the high absorption state greater than 1300 per centimeter.

38. The method of claim 27, wherein the light output from the output coupler is either through a substrate, or through a top surface or both.

39. The method of claim 27, further comprising controlling the temperature difference between the laser and the modulator.

40. The method of claim 39, wherein the temperature difference is controlled using the optical power coupling from the laser to the modulator.

41. The method of claim 39, wherein the temperature difference is controlled using a current passing through the laser.

42. The method of claim 39, wherein the temperature difference is controlled using a DC applied voltage on the modulator.

43. The method of claim 39, wherein the temperature difference is controlled using at least one heater element.

44. The method of claim 27, further comprising selecting an operating wavelength using a laser driving current.

45. The method of claim 27, further comprising selecting an operating wavelength using both a laser driving current and a temperature of the laser.

46. The method of claim 27, wherein the quantum wells of the modulator are tilted.

47. A laser with integrated modulator, comprising:
a laser capable of emitting light, the laser further comprises a laser gain section, a first mirror and a second mirror, each of the mirrors coupled to the laser gain section;
wherein the laser gain section contains quantum wells;
wherein the first mirror and the second mirror have a wavelength bandwidth sufficient for a lasing wavelength range of the laser;
wherein the first mirror and the second mirror are high spectral bandwidth mirrors;
a modulator coupled to the laser to receive the light and capable of modulating the light to vary the output from the modulator;
wherein the modulator contains quantum wells and the modulator has a quantum well confinement factor that is greater than 0.1,
an output coupler coupled to the modulator, wherein the output coupler has a back reflection that is less than half of a back reflection of the second mirror;
wherein the laser has a lasing wavelength that tracks the absorption spectrum of the modulator over temperature; and
wherein the quantum wells of the laser gain section and the quantum wells of the modulator are tilted.

* * * * *